United States Patent
Rajan et al.

(10) Patent No.: US 8,019,589 B2
(45) Date of Patent: Sep. 13, 2011

(54) MEMORY APPARATUS OPERABLE TO PERFORM A POWER-SAVING OPERATION

(75) Inventors: Suresh Natarajan Rajan, San Jose, CA (US); Keith R. Schakel, San Jose, CA (US); Michael John Sebastian Smith, Palo Alto, CA (US); David T. Wang, San Jose, CA (US); Frederick Daniel Weber, San Jose, CA (US)

(73) Assignee: Google Inc., Mountain View, CA (US)

( * ) Notice: Subject to any disclaimer, the term of this patent is extended or adjusted under 35 U.S.C. 154(b) by 302 days.

(21) Appl. No.: 11/929,320

(22) Filed: Oct. 30, 2007

(65) Prior Publication Data

US 2008/0126692 A1 May 29, 2008

Related U.S. Application Data

(63) Continuation of application No. 11/762,010, filed on Jun. 12, 2007, which is a continuation-in-part of application No. 11/461,420, filed on Jul. 31, 2006.

(51) Int. Cl.
*G06F 9/44* (2006.01)
*G11C 8/00* (2006.01)

(52) U.S. Cl. ............ 703/24; 365/185.09; 365/189.05; 365/227; 711/105; 327/544; 713/320

(58) Field of Classification Search .............. 703/23, 703/24; 365/185.09, 189.05; 711/105
See application file for complete search history.

(56) References Cited

U.S. PATENT DOCUMENTS

| | | |
|---|---|---|
| 3,800,292 A | 3/1974 | Curley et al. |
| 4,069,452 A | 1/1978 | Conway et al. |
| 4,334,307 A | 6/1982 | Bourgeois et al. |
| 4,345,319 A | 8/1982 | Bernardini et al. |
| 4,392,212 A | 7/1983 | Miyasaka et al. ............ 365/230 |
| 4,525,921 A | 7/1985 | Carson et al. |
| 4,566,082 A | 1/1986 | Anderson |
| 4,592,019 A | 5/1986 | Huang et al. .................. 365/78 |
| 4,646,128 A | 2/1987 | Carson et al. |
| 4,698,748 A | 10/1987 | Juzswik et al. ............... 364/200 |
| 4,706,166 A | 11/1987 | Go |
| 4,710,903 A | 12/1987 | Hereth et al. ................. 365/194 |
| 4,764,846 A | 8/1988 | Go |
| 4,780,843 A | 10/1988 | Tietjen ........................ 364/900 |

(Continued)

FOREIGN PATENT DOCUMENTS

DE 102004051345 5/2006

(Continued)

OTHER PUBLICATIONS

Office Action from U.S. Appl. No. 11/461,427 mailed on Sep. 5, 2008.

(Continued)

*Primary Examiner* — Thai Phan
(74) *Attorney, Agent, or Firm* — Fish & Richardson P.C.

(57) ABSTRACT

A memory subsystem is provided including an interface circuit adapted for communication with a system and a majority of address or control signals of a first number of memory circuits. The interface circuit includes emulation logic for emulating at least one memory circuit of a second number.

17 Claims, 18 Drawing Sheets

U.S. PATENT DOCUMENTS

| | | |
|---|---|---|
| 4,794,597 A | 12/1988 | Ooba et al. |
| 4,796,232 A | 1/1989 | House ............................ 365/189 |
| 4,841,440 A | 6/1989 | Yonezu et al. ................. 364/200 |
| 4,862,347 A | 8/1989 | Rudy |
| 4,887,240 A | 12/1989 | Garverick et al. ............ 361/222 |
| 4,899,107 A | 2/1990 | Corbett et al. ................. 324/158 |
| 4,912,678 A | 3/1990 | Mashiko |
| 4,922,451 A | 5/1990 | Lo et al. |
| 4,935,734 A | 6/1990 | Austin ..................... 340/825.83 |
| 4,937,791 A | 6/1990 | Steele et al. |
| 4,956,694 A | 9/1990 | Eide |
| 4,959,774 A * | 9/1990 | Davis ............................ 714/6.1 |
| 4,982,265 A | 1/1991 | Watanabe et al. |
| 4,983,533 A | 1/1991 | Go |
| 5,025,364 A | 6/1991 | Zellmer |
| 5,072,424 A | 12/1991 | Brent et al. .................... 365/189 |
| 5,083,266 A | 1/1992 | Watanabe ...................... 395/275 |
| 5,104,820 A | 4/1992 | Go et al. |
| 5,220,672 A | 6/1993 | Nakao et al. ................... 395/750 |
| 5,241,266 A | 8/1993 | Ahmad et al. ................. 324/158 |
| 5,252,807 A | 10/1993 | Chizinsky ..................... 219/390 |
| 5,257,233 A | 10/1993 | Schaefer ........................ 365/227 |
| 5,278,796 A | 1/1994 | Tillinghast et al. ........... 365/211 |
| 5,282,177 A | 1/1994 | McLaury ....................... 365/230 |
| 5,332,922 A | 7/1994 | Oguchi et al. ................. 257/723 |
| 5,347,428 A | 9/1994 | Carson et al. |
| 5,384,745 A | 1/1995 | Konishi et al. ............ 365/230.03 |
| 5,388,265 A | 2/1995 | Volk ............................... 395/750 |
| 5,390,334 A | 2/1995 | Harrison |
| 5,408,190 A | 4/1995 | Wood et al. ................... 324/765 |
| 5,453,434 A | 9/1995 | Albaugh et al. ............... 514/397 |
| 5,467,455 A | 11/1995 | Gay et al. ...................... 395/281 |
| 5,498,886 A | 3/1996 | Hsu et al. ....................... 257/213 |
| 5,502,333 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,526,320 A | 6/1996 | Zagar et al. .................... 365/233 |
| 5,530,836 A | 6/1996 | Busch et al. ................... 395/477 |
| 5,559,990 A | 9/1996 | Cheng et al. .................. 395/484 |
| 5,563,086 A | 10/1996 | Bertin et al. |
| 5,566,344 A | 10/1996 | Hall et al. ...................... 395/800 |
| 5,581,779 A | 12/1996 | Hall et al. ...................... 395/800 |
| 5,590,071 A | 12/1996 | Kolor et al. .................... 365/149 |
| 5,598,376 A | 1/1997 | Merritt et al. .................. 365/230 |
| 5,604,714 A | 2/1997 | Manning et al. .............. 365/230 |
| 5,606,710 A | 2/1997 | Hall et al. ...................... 395/800 |
| 5,608,262 A | 3/1997 | Degani et al. |
| 5,610,864 A | 3/1997 | Manning ....................... 365/193 |
| 5,623,686 A | 4/1997 | Hall et al. ...................... 395/800 |
| 5,627,791 A | 5/1997 | Wright et al. .................. 365/222 |
| 5,640,337 A | 6/1997 | Huang et al. .................. 364/578 |
| 5,640,364 A | 6/1997 | Merritt et al. .................. 365/233 |
| 5,652,724 A | 7/1997 | Manning ....................... 365/189 |
| 5,654,204 A | 8/1997 | Anderson ........................ 438/15 |
| 5,661,677 A | 8/1997 | Rondeau et al. ................. 365/63 |
| 5,661,695 A | 8/1997 | Zagar et al. .................... 365/233 |
| 5,668,773 A | 9/1997 | Zagar et al. .................... 365/233 |
| 5,675,549 A | 10/1997 | Ong et al. ...................... 365/233 |
| 5,682,354 A | 10/1997 | Manning ....................... 365/233 |
| 5,692,121 A | 11/1997 | Bozso et al. |
| 5,692,202 A | 11/1997 | Kardach et al. ............... 395/750 |
| 5,696,732 A | 12/1997 | Zagar et al. .................... 365/233 |
| 5,702,984 A | 12/1997 | Bertin et al. |
| 5,703,813 A | 12/1997 | Manning et al. .............. 365/189 |
| 5,706,247 A | 1/1998 | Merritt et al. .................. 365/233 |
| RE35,733 E | 2/1998 | Hernandez et al. |
| 5,717,654 A | 2/1998 | Manning ....................... 365/233 |
| 5,721,859 A | 2/1998 | Manning ....................... 397/421 |
| 5,724,288 A | 3/1998 | Cloud et al. ................... 365/193 |
| 5,729,503 A | 3/1998 | Manning ....................... 365/233 |
| 5,729,504 A | 3/1998 | Cowles .......................... 365/236 |
| 5,742,792 A | 4/1998 | Yanai et al. |
| 5,748,914 A | 5/1998 | Barth et al. .................... 395/283 |
| 5,752,045 A | 5/1998 | Chen .............................. 395/750 |
| 5,757,703 A | 5/1998 | Merritt et al. .................. 365/189 |
| 5,761,703 A | 6/1998 | Bolyn ............................ 711/106 |
| 5,781,766 A | 7/1998 | Davis ............................. 395/552 |
| 5,787,457 A | 7/1998 | Miller et al. |
| 5,798,961 A | 8/1998 | Heyden et al. .................. 365/52 |
| 5,802,010 A | 9/1998 | Zagar et al. .................... 365/233 |
| 5,802,555 A | 9/1998 | Shigeeda ....................... 711/106 |
| 5,812,488 A | 9/1998 | Zagar et al. .................... 365/233 |
| 5,831,833 A | 11/1998 | Shirakawa et al. |
| 5,831,931 A | 11/1998 | Manning ....................... 365/233 |
| 5,831,932 A | 11/1998 | Merritt et al. .................. 365/233 |
| 5,834,838 A | 11/1998 | Anderson ...................... 257/697 |
| 5,835,435 A | 11/1998 | Bogin et al. ..................... 365/22 |
| 5,838,165 A | 11/1998 | Chatter |
| 5,838,177 A | 11/1998 | Keeth ............................. 327/108 |
| 5,841,580 A | 11/1998 | Farmwald et al. ............ 365/194 |
| 5,843,799 A | 12/1998 | Hsu et al. .......................... 438/6 |
| 5,843,807 A | 12/1998 | Burns |
| 5,845,108 A | 12/1998 | Yoo et al. ....................... 395/551 |
| 5,850,368 A | 12/1998 | Ong et al. ...................... 365/238 |
| 5,859,792 A | 1/1999 | Rondeau et al. ................. 365/52 |
| 5,860,106 A | 1/1999 | Domen et al. ................. 711/137 |
| 5,870,347 A | 2/1999 | Keeth et al. .................... 365/230 |
| 5,870,350 A | 2/1999 | Bertin et al. |
| 5,872,907 A | 2/1999 | Griess et al. |
| 5,875,142 A | 2/1999 | Chevallier ..................... 365/212 |
| 5,878,279 A | 3/1999 | Athenes |
| 5,884,088 A | 3/1999 | Kardach et al. .......... 395/750.06 |
| 5,901,105 A | 5/1999 | Ong et al. ................. 365/230.06 |
| 5,903,500 A | 5/1999 | Tsang et al. .............. 365/189.05 |
| 5,905,688 A | 5/1999 | Park ............................... 365/227 |
| 5,907,512 A | 5/1999 | Parkinson et al. ............. 365/195 |
| 5,915,105 A | 6/1999 | Farmwald et al. ............ 395/309 |
| 5,915,167 A | 6/1999 | Leedy |
| 5,917,758 A | 6/1999 | Keeth ....................... 365/189.05 |
| 5,923,611 A | 7/1999 | Ryan .............................. 365/233 |
| 5,926,435 A | 7/1999 | Park et al. |
| 5,929,650 A | 7/1999 | Pappert et al. ................. 324/763 |
| 5,946,265 A | 8/1999 | Cowles .......................... 365/233 |
| 5,949,254 A | 9/1999 | Keeth ............................... 326/87 |
| 5,953,263 A | 9/1999 | Farmwald et al. ............ 365/194 |
| 5,954,804 A | 9/1999 | Farmwald et al. .............. 710/36 |
| 5,962,435 A | 10/1999 | Mao et al. ........................ 514/63 |
| 5,963,429 A | 10/1999 | Chen |
| 5,963,463 A | 10/1999 | Rondeau et al. ................. 365/52 |
| 5,963,504 A | 10/1999 | Manning ....................... 365/233 |
| 5,966,724 A | 10/1999 | Ryan .............................. 711/105 |
| 5,966,727 A | 10/1999 | Nishino ......................... 711/127 |
| 5,969,996 A | 10/1999 | Muranaka et al. ........ 365/189.01 |
| 5,973,392 A | 10/1999 | Senba et al. |
| 5,995,424 A | 11/1999 | Lawrence et al. |
| 5,995,443 A | 11/1999 | Farmwald et al. ............ 365/233 |
| 6,001,671 A | 12/1999 | Fjelstad |
| 6,002,613 A | 12/1999 | Cloud et al. ................... 365/189 |
| 6,002,627 A | 12/1999 | Chevallier ..................... 365/212 |
| 6,014,339 A | 1/2000 | Kobayashi et al. ............ 365/233 |
| 6,016,282 A | 1/2000 | Keeth ............................. 365/233 |
| 6,026,050 A | 2/2000 | Baker et al. .................... 365/233 |
| 6,029,250 A | 2/2000 | Keeth ............................. 713/400 |
| 6,032,214 A | 2/2000 | Farmwald et al. ............ 710/129 |
| 6,032,215 A | 2/2000 | Farmwald et al. ............ 710/129 |
| 6,034,916 A | 3/2000 | Lee ................................ 365/233 |
| 6,034,918 A | 3/2000 | Farmwald et al. ............ 365/233 |
| 6,035,365 A | 3/2000 | Farmwald et al. ............ 710/129 |
| 6,038,195 A | 3/2000 | Farmwald et al. ............ 365/233 |
| 6,038,673 A | 3/2000 | Benn et al. ..................... 713/323 |
| 6,044,032 A | 3/2000 | Li .................................. 365/230 |
| 6,047,073 A | 4/2000 | Norris et al. |
| 6,047,344 A | 4/2000 | Kawasumi et al. ............ 710/107 |
| 6,053,948 A | 4/2000 | Vaidyanathan et al. ........ 703/14 |
| 6,069,504 A | 5/2000 | Keeth ............................. 327/108 |
| 6,073,223 A | 6/2000 | McAllister et al. ............ 711/167 |
| 6,075,730 A | 6/2000 | Barth et al. .................... 365/191 |
| 6,075,744 A | 6/2000 | Tsern et al. .................... 365/230 |
| 6,078,546 A | 6/2000 | Lee ................................ 365/233 |
| 6,079,025 A | 6/2000 | Fung .............................. 713/323 |
| 6,084,434 A | 7/2000 | Keeth ............................... 326/87 |
| 6,088,290 A | 7/2000 | Ohtake et al. ................. 365/233 |
| 6,091,251 A | 7/2000 | Wood et al. ................... 324/755 |
| RE36,839 E | 8/2000 | Simmons et al. ................ 326/93 |
| 6,101,152 A | 8/2000 | Farmwald et al. ............ 365/233 |
| 6,101,564 A | 8/2000 | Athenes et al. |

| | | | | | | | |
|---|---|---|---|---|---|---|---|
| 6,101,612 | A | 8/2000 | Jeddeloh ............... 713/401 | 6,574,150 | B2 | 6/2003 | Suyama et al. ......... 365/189.05 |
| 6,108,795 | A | 8/2000 | Jeddeloh ............... 713/401 | 6,584,037 | B2 | 6/2003 | Farmwald et al. ........... 365/233 |
| 6,111,812 | A | 8/2000 | Gans et al. ................ 365/233 | 6,587,912 | B2 | 7/2003 | Leddige et al. ................. 711/5 |
| 6,134,638 | A | 10/2000 | Olarig et al. ............. 711/167 | 6,590,822 | B2 | 7/2003 | Hwang et al. ............... 365/222 |
| 6,166,991 | A | 12/2000 | Phelan ........................ 365/233 | 6,594,770 | B1 | 7/2003 | Sato et al. ..................... 713/320 |
| 6,182,184 | B1 | 1/2001 | Farmwald et al. ......... 710/129 | 6,597,616 | B2 | 7/2003 | Tsern et al. ................... 365/222 |
| 6,208,168 | B1 | 3/2001 | Rhee .............................. 326/83 | 6,614,700 | B2 | 9/2003 | Dietrich et al. .............. 365/194 |
| 6,216,246 | B1 | 4/2001 | Shau ............................ 714/763 | 6,618,791 | B1 | 9/2003 | Dodd et al. ................... 711/105 |
| 6,226,709 | B1 | 5/2001 | Goodwin et al. | 6,621,760 | B1 | 9/2003 | Ahmad et al. ................ 365/233 |
| 6,240,048 | B1 | 5/2001 | Matsubara .................. 365/233 | 6,630,729 | B2 | 10/2003 | Huang |
| 6,243,282 | B1 | 6/2001 | Rondeau et al. ............... 365/52 | 6,631,086 | B1 | 10/2003 | Bill et al. .................. 365/185.09 |
| 6,260,097 | B1 | 7/2001 | Farmwald et al. ......... 710/129 | 6,650,588 | B2 | 11/2003 | Yamagata .................... 365/222 |
| 6,260,154 | B1 | 7/2001 | Jeddeloh ..................... 713/401 | 6,650,594 | B1 | 11/2003 | Lee et al. ...................... 365/233 |
| 6,262,938 | B1 | 7/2001 | Lee et al. ..................... 365/233 | 6,657,634 | B1 | 12/2003 | Sinclair et al. |
| 6,266,285 | B1 | 7/2001 | Farmwald et al. ......... 365/194 | 6,657,918 | B2 | 12/2003 | Foss et al. .................... 365/233 |
| 6,266,292 | B1 | 7/2001 | Tsern et al. .................. 365/230 | 6,657,919 | B2 | 12/2003 | Foss et al. .................... 365/233 |
| 6,274,395 | B1 | 8/2001 | Weber ............................. 438/14 | 6,658,016 | B1 | 12/2003 | Dai et al. |
| 6,279,069 | B1 | 8/2001 | Robinson et al. ............ 711/103 | 6,658,530 | B1 | 12/2003 | Robertson et al. ........... 711/115 |
| 6,295,572 | B1 | 9/2001 | Wu ............................... 710/131 | 6,665,224 | B1 | 12/2003 | Lehmann et al. ............. 365/222 |
| 6,298,426 | B1 | 10/2001 | Ajanovic ..................... 711/172 | 6,665,227 | B2 | 12/2003 | Fetzer ........................... 365/229 |
| 6,304,511 | B1 | 10/2001 | Gans et al. ................... 365/233 | 6,668,242 | B1 | 12/2003 | Reynov et al. |
| 6,307,769 | B1 | 10/2001 | Nuxoll et al. ................... 365/63 | 6,674,154 | B2 | 1/2004 | Minamio et al. |
| 6,314,051 | B1 | 11/2001 | Farmwald et al. ......... 365/233 | 6,683,372 | B1 | 1/2004 | Wong et al. |
| 6,317,352 | B1 | 11/2001 | Halbert et al. .................. 365/52 | 6,684,292 | B2 | 1/2004 | Piccirillo et al. |
| 6,317,381 | B1 | 11/2001 | Gans et al. ................... 365/233 | 6,697,295 | B2 | 2/2004 | Farmwald et al. ........... 365/233 |
| 6,324,120 | B2 | 11/2001 | Farmwald et al. ......... 365/233 | 6,701,446 | B2 | 3/2004 | Tsern et al. ................... 713/501 |
| 6,326,810 | B1 | 12/2001 | Keeth ............................. 326/83 | 6,705,877 | B1 | 3/2004 | Li et al. |
| 6,327,664 | B1 | 12/2001 | Dell et al. .................... 713/323 | 6,708,144 | B1 | 3/2004 | Merryman et al. ............. 703/14 |
| 6,330,683 | B1 | 12/2001 | Jeddeloh ..................... 713/401 | 6,710,430 | B2 | 3/2004 | Minamio et al. |
| 6,336,174 | B1 | 1/2002 | Li et al. | 6,713,856 | B2 | 3/2004 | Tsai et al. |
| 6,338,108 | B1 | 1/2002 | Motomura ................... 710/110 | 6,714,891 | B2 | 3/2004 | Dendinger .................... 702/132 |
| 6,338,113 | B1 | 1/2002 | Kubo et al. ................... 711/105 | 6,724,684 | B2 | 4/2004 | Kim ............................... 365/233 |
| 6,341,347 | B1 | 1/2002 | Joy et al. ...................... 712/228 | 6,731,527 | B2 | 5/2004 | Brown ............................. 365/63 |
| 6,343,042 | B1 | 1/2002 | Tsern et al. ................... 365/222 | 6,742,098 | B1 | 5/2004 | Halbert et al. |
| 6,353,561 | B1 | 3/2002 | Funyu et al. ................. 365/195 | 6,744,687 | B2 | 6/2004 | Koo et al. ..................... 365/226 |
| 6,356,105 | B1 | 3/2002 | Volk ............................... 326/30 | 6,747,887 | B2 | 6/2004 | Halbert et al. |
| 6,356,500 | B1 | 3/2002 | Cloud et al. ................. 365/226 | 6,751,696 | B2 | 6/2004 | Farmwald et al. ........... 710/305 |
| 6,362,656 | B2 | 3/2002 | Rhee .............................. 326/87 | 6,754,129 | B2 | 6/2004 | Khateri et al. ................ 365/226 |
| 6,363,031 | B2 | 3/2002 | Phelan ........................... 365/233 | 6,754,132 | B2 | 6/2004 | Kyung ........................... 365/233 |
| 6,378,020 | B2 | 4/2002 | Farmwald et al. ......... 710/129 | 6,762,948 | B2 | 7/2004 | Kyun et al. ...................... 365/51 |
| 6,381,188 | B1 | 4/2002 | Choi et al. .................... 365/222 | 6,766,469 | B2 | 7/2004 | Larson et al. |
| 6,381,668 | B1 | 4/2002 | Lunteren ........................... 711/5 | 6,779,097 | B2 | 8/2004 | Gillingham et al. .......... 711/167 |
| 6,414,868 | B1 | 7/2002 | Wong et al. ..................... 365/51 | 6,785,767 | B2 | 8/2004 | Coulson ........................ 711/112 |
| 6,421,754 | B1 | 7/2002 | Kau et al. | 6,791,877 | B2 | 9/2004 | Miura et al. .................. 365/185 |
| 6,424,532 | B2 | 7/2002 | Kawamura | 6,795,899 | B2 | 9/2004 | Dodd et al. ................... 711/137 |
| 6,426,916 | B2 | 7/2002 | Farmwald et al. ......... 365/233 | 6,799,241 | B2 | 9/2004 | Kahn et al. ................... 711/105 |
| 6,429,029 | B1 | 8/2002 | Eldridge et al. ................ 438/14 | 6,801,989 | B2 | 10/2004 | Johnson et al. ............... 711/167 |
| 6,430,103 | B2 | 8/2002 | Nakayama et al. ....... 365/230.03 | 6,807,598 | B2 | 10/2004 | Farmwald et al. ........... 710/305 |
| 6,437,600 | B1 | 8/2002 | Keeth ............................. 326/86 | 6,807,655 | B1 | 10/2004 | Rehani et al. ..................... 716/4 |
| 6,438,057 | B1 | 8/2002 | Ruckerbauer ................ 365/222 | 6,816,991 | B2 | 11/2004 | Sanghani ...................... 714/733 |
| 6,442,698 | B2 | 8/2002 | Nizar ............................ 713/320 | 6,819,602 | B2 | 11/2004 | Seo et al. ...................... 365/193 |
| 6,445,591 | B1 | 9/2002 | Kwong | 6,819,617 | B2 | 11/2004 | Hwang et al. ................ 365/222 |
| 6,452,863 | B2 | 9/2002 | Farmwald et al. ......... 365/233 | 6,820,163 | B1 | 11/2004 | McCall et al. ................ 710/310 |
| 6,453,400 | B1 | 9/2002 | Maesako et al. ............. 711/167 | 6,820,169 | B2 | 11/2004 | Wilcox et al. ................ 711/105 |
| 6,453,402 | B1 | 9/2002 | Jeddeloh ....................... 711/167 | 6,826,104 | B2 | 11/2004 | Kawaguchi et al. .......... 365/222 |
| 6,453,434 | B2 | 9/2002 | Delp et al. | 6,839,290 | B2 | 1/2005 | Ahmad et al. ................ 365/193 |
| 6,455,348 | B1 | 9/2002 | Yamaguchi | 6,845,027 | B2 | 1/2005 | Mayer et al. |
| 6,457,095 | B1 | 9/2002 | Volk ............................. 711/105 | 6,845,055 | B1 | 1/2005 | Koga et al. ................... 365/229 |
| 6,459,651 | B1 | 10/2002 | Lee et al. ..................... 365/233 | 6,847,582 | B2 | 1/2005 | Pan ................................ 365/233 |
| 6,473,831 | B1 | 10/2002 | Schade ......................... 711/115 | 6,850,449 | B2 | 2/2005 | Takahashi ..................... 365/222 |
| 6,480,929 | B1 | 11/2002 | Gauthier et al. ............. 711/105 | 6,862,249 | B2 | 3/2005 | Kyung ........................... 365/233 |
| 6,489,669 | B2 | 12/2002 | Shimada et al. | 6,862,653 | B2 | 3/2005 | Dodd et al. ................... 711/105 |
| 6,493,789 | B2 | 12/2002 | Ware et al. ................... 711/105 | 6,878,570 | B2 | 4/2005 | Lyu et al. |
| 6,496,440 | B2 | 12/2002 | Manning .................. 365/230.03 | 6,894,933 | B2 | 5/2005 | Kuzmenka et al. ....... 365/189.05 |
| 6,496,897 | B2 | 12/2002 | Ware et al. ................... 711/105 | 6,898,683 | B2 | 5/2005 | Nakamura .................... 711/167 |
| 6,498,766 | B2 | 12/2002 | Lee et al. ..................... 365/233 | 6,908,314 | B2 | 6/2005 | Brown ............................. 439/68 |
| 6,510,097 | B2 | 1/2003 | Fukuyama ................ 365/230.03 | 6,912,778 | B2 | 7/2005 | Ahn et al. ........................ 29/852 |
| 6,510,503 | B2 | 1/2003 | Gillingham et al. ........ 711/167 | 6,914,786 | B1 | 7/2005 | Paulsen et al. |
| 6,512,392 | B2 | 1/2003 | Fleury et al. ................. 324/765 | 6,917,219 | B2 | 7/2005 | New ............................... 326/41 |
| 6,521,984 | B2 | 2/2003 | Matsuura | 6,922,371 | B2 | 7/2005 | Takahashi et al. ............ 365/227 |
| 6,526,471 | B1 | 2/2003 | Shimomura et al. ............. 711/5 | 6,938,119 | B2 | 8/2005 | Kohn et al. ................... 711/105 |
| 6,526,484 | B1 | 2/2003 | Stacovsky et al. ........... 711/158 | 6,943,450 | B2 | 9/2005 | Fee et al. |
| 6,546,446 | B2 | 4/2003 | Farmwald et al. ......... 710/305 | 6,944,748 | B2 | 9/2005 | Sanches et al. |
| 6,553,450 | B1 | 4/2003 | Dodd et al. ................... 711/105 | 6,947,341 | B2 | 9/2005 | Stubbs et al. |
| 6,560,158 | B2 | 5/2003 | Choi et al. .................... 365/226 | 6,951,982 | B2 | 10/2005 | Chye et al. |
| 6,563,337 | B2 | 5/2003 | Dour ............................... 326/30 | 6,952,794 | B2 | 10/2005 | Lu |
| 6,563,759 | B2 | 5/2003 | Yahata et al. ................. 365/233 | 6,961,281 | B2 | 11/2005 | Wong et al. ............... 365/230.03 |
| 6,564,281 | B2 | 5/2003 | Farmwald et al. ......... 710/305 | 6,968,416 | B2 | 11/2005 | Moy .............................. 710/310 |
| 6,564,285 | B1 | 5/2003 | Mills et al. ................... 711/103 | 6,968,419 | B1 | 11/2005 | Holman ............................ 711/5 |

| Patent/Pub No. | Date | Inventor | Class |
|---|---|---|---|
| 6,970,968 B1 | 11/2005 | Holman | 711/5 |
| 6,980,021 B1 | 12/2005 | Srivastava et al. | 326/30 |
| 6,986,118 B2 | 1/2006 | Dickman | 716/8 |
| 6,992,950 B2 | 1/2006 | Foss et al. | 365/233 |
| 7,000,062 B2 | 2/2006 | Perego et al. | 711/5 |
| 7,003,618 B2 | 2/2006 | Perego et al. | 711/5 |
| 7,003,639 B2 | 2/2006 | Tsern et al. | 711/154 |
| 7,007,095 B2 | 2/2006 | Chen et al. | |
| 7,007,175 B2 | 2/2006 | Chang et al. | 713/300 |
| 7,010,642 B2 | 3/2006 | Perego et al. | 711/5 |
| 7,010,736 B1 | 3/2006 | Teh et al. | 714/733 |
| 7,024,518 B2 | 4/2006 | Halbert et al. | 711/115 |
| 7,026,708 B2 | 4/2006 | Cady et al. | |
| 7,028,215 B2 | 4/2006 | Depew et al. | |
| 7,028,234 B2 | 4/2006 | Huckaby et al. | 714/710 |
| 7,035,150 B2 | 4/2006 | Streif et al. | 365/194 |
| 7,043,599 B1 | 5/2006 | Ware et al. | 711/106 |
| 7,045,396 B2 | 5/2006 | Crowley et al. | |
| 7,045,901 B2 | 5/2006 | Lin et al. | |
| 7,053,470 B1 | 5/2006 | Sellers et al. | |
| 7,053,478 B2 | 5/2006 | Roper et al. | |
| 7,058,776 B2 | 6/2006 | Lee | 711/167 |
| 7,058,863 B2 | 6/2006 | Kouchi et al. | 714/718 |
| 7,061,823 B2 | 6/2006 | Faue et al. | 365/230.08 |
| 7,066,741 B2 | 6/2006 | Burns et al. | |
| 7,075,175 B2 | 7/2006 | Kazi et al. | 257/678 |
| 7,079,396 B2 | 7/2006 | Gates et al. | |
| 7,079,441 B1 | 7/2006 | Partsch et al. | 365/226 |
| 7,079,446 B2 | 7/2006 | Murtagh et al. | 365/233 |
| 7,085,152 B2 | 8/2006 | Ellis et al. | 365/149 |
| 7,085,941 B2 | 8/2006 | Li | 713/300 |
| 7,089,438 B2 | 8/2006 | Raad | 713/322 |
| 7,093,101 B2 | 8/2006 | Aasheim et al. | 711/207 |
| 7,103,730 B2 | 9/2006 | Saxena et al. | 711/156 |
| 7,119,428 B2 | 10/2006 | Tanie et al. | |
| 7,120,727 B2 | 10/2006 | Lee et al. | 711/5 |
| 7,126,399 B1 | 10/2006 | Lee | 327/261 |
| 7,127,567 B2 | 10/2006 | Ramakrishnan et al. | |
| 7,133,960 B1 | 11/2006 | Thompson et al. | 711/5 |
| 7,136,978 B2 | 11/2006 | Miura et al. | 711/165 |
| 7,149,145 B2 | 12/2006 | Kim et al. | 365/233 |
| 7,149,824 B2 | 12/2006 | Johnson | 710/35 |
| 7,173,863 B2 | 2/2007 | Conley et al. | 365/189 |
| 7,200,021 B2 | 4/2007 | Raghuram | 365/51 |
| 7,205,789 B1 | 4/2007 | Karabatsos | 326/30 |
| 7,210,059 B2 | 4/2007 | Jeddeloh | |
| 7,215,561 B2 | 5/2007 | Park et al. | |
| 7,218,566 B1 | 5/2007 | Totolos, Jr. et al. | |
| 7,224,595 B2 | 5/2007 | Dreps et al. | 365/63 |
| 7,228,264 B2 | 6/2007 | Barrenscheen et al. | 703/23 |
| 7,231,562 B2 | 6/2007 | Ohlhoff et al. | |
| 7,233,541 B2 | 6/2007 | Yamamoto et al. | 365/230.03 |
| 7,234,081 B2 | 6/2007 | Nguyen et al. | |
| 7,243,185 B2 | 7/2007 | See et al. | |
| 7,245,541 B2 | 7/2007 | Janzen | 365/198 |
| 7,254,036 B2 | 8/2007 | Pauley et al. | 361/721 |
| 7,266,639 B2 | 9/2007 | Raghuram | 711/115 |
| 7,269,042 B2 | 9/2007 | Kinsley et al. | 365/52 |
| 7,269,708 B2 | 9/2007 | Ware | 711/203 |
| 7,274,583 B2 | 9/2007 | Park et al. | |
| 7,286,436 B2 | 10/2007 | Bhakta et al. | 365/230 |
| 7,289,386 B2 | 10/2007 | Bhakta et al. | 365/230 |
| 7,296,754 B2 | 11/2007 | Nishizawa et al. | 235/492 |
| 7,299,330 B2 | 11/2007 | Gillingham et al. | 711/167 |
| 7,302,598 B2 | 11/2007 | Suzuki et al. | |
| 7,307,863 B2 | 12/2007 | Yen et al. | 365/63 |
| 7,317,250 B2 | 1/2008 | Koh et al. | |
| 7,363,422 B2 | 4/2008 | Perego et al. | 711/105 |
| 7,366,947 B2 | 4/2008 | Gower et al. | |
| 7,379,316 B2 | 5/2008 | Rajan | 365/63 |
| 7,386,656 B2 | 6/2008 | Rajan et al. | 711/103 |
| 7,392,338 B2 | 6/2008 | Rajan et al. | 711/103 |
| 7,408,393 B1 | 8/2008 | Jain et al. | 327/202 |
| 7,409,492 B2 | 8/2008 | Tanaka et al. | 711/103 |
| 7,428,644 B2 | 9/2008 | Jeddeloh et al. | |
| 7,437,579 B2 | 10/2008 | Jeddeloh et al. | 713/300 |
| 7,457,122 B2 | 11/2008 | Lai et al. | |
| 7,464,225 B2 | 12/2008 | Tsern | 711/115 |
| 7,472,220 B2 | 12/2008 | Rajan et al. | 711/103 |
| 7,474,576 B2 | 1/2009 | Co et al. | |
| 7,480,147 B2 | 1/2009 | Hoss et al. | |
| 7,480,774 B2 | 1/2009 | Ellis et al. | |
| 7,496,777 B2 | 2/2009 | Kapil | 713/324 |
| 7,515,453 B2 | 4/2009 | Rajan | 365/63 |
| 7,532,537 B2 | 5/2009 | Solomon et al. | 365/230 |
| 7,539,800 B2 | 5/2009 | Dell et al. | |
| 7,573,136 B2 | 8/2009 | Jiang et al. | |
| 7,580,312 B2 | 8/2009 | Rajan et al. | |
| 7,581,121 B2 | 8/2009 | Barth et al. | |
| 7,581,127 B2 | 8/2009 | Rajan et al. | |
| 7,590,796 B2 | 9/2009 | Rajan et al. | |
| 7,599,205 B2 | 10/2009 | Rajan | |
| 7,606,245 B2 | 10/2009 | Ma et al. | |
| 7,609,567 B2 | 10/2009 | Rajan et al. | |
| 7,613,880 B2 | 11/2009 | Miura et al. | |
| 7,724,589 B2 | 5/2010 | Rajan et al. | |
| 7,730,338 B2 | 6/2010 | Rajan et al. | |
| 7,761,724 B2 | 7/2010 | Rajan et al. | |
| 2001/0000822 A1 | 5/2001 | Dell et al. | 711/170 |
| 2001/0003198 A1 | 6/2001 | Wu | |
| 2001/0011322 A1 | 8/2001 | Stolt et al. | |
| 2001/0021106 A1 | 9/2001 | Weber et al. | |
| 2001/0046163 A1 | 11/2001 | Yanagawa | |
| 2002/0004897 A1 | 1/2002 | Kao et al. | |
| 2002/0015340 A1 | 2/2002 | Batinovich | |
| 2002/0019961 A1 | 2/2002 | Blodgett | 714/718 |
| 2002/0034068 A1 | 3/2002 | Weber et al. | |
| 2002/0038405 A1 | 3/2002 | Leddige et al. | 711/115 |
| 2002/0041507 A1 | 4/2002 | Woo et al. | 365/51 |
| 2002/0051398 A1 | 5/2002 | Mizugaki | 365/222 |
| 2002/0060945 A1 | 5/2002 | Ikeda | |
| 2002/0064073 A1 | 5/2002 | Chien | 365/200 |
| 2002/0064083 A1 | 5/2002 | Ryu et al. | 365/233 |
| 2002/0089831 A1 | 7/2002 | Forthun | |
| 2002/0089970 A1 | 7/2002 | Asada et al. | |
| 2002/0121650 A1 | 9/2002 | Minamio et al. | |
| 2002/0121670 A1 | 9/2002 | Minamio et al. | |
| 2002/0124195 A1 | 9/2002 | Nizar | 713/320 |
| 2002/0129204 A1 | 9/2002 | Leighnor et al. | |
| 2002/0145900 A1 | 10/2002 | Schaefer | 365/52 |
| 2002/0165706 A1 | 11/2002 | Raynham | 703/25 |
| 2002/0174274 A1 | 11/2002 | Wu et al. | 710/100 |
| 2002/0184438 A1 | 12/2002 | Usui | 711/106 |
| 2003/0002262 A1 | 1/2003 | Benisek et al. | 361/728 |
| 2003/0011993 A1 | 1/2003 | Summers et al. | |
| 2003/0021175 A1 | 1/2003 | Tae Kwak | 365/219 |
| 2003/0026155 A1 | 2/2003 | Yamagata | |
| 2003/0026159 A1 | 2/2003 | Frankowsky et al. | |
| 2003/0035312 A1 | 2/2003 | Halbert et al. | |
| 2003/0041295 A1 | 2/2003 | Hou et al. | |
| 2003/0061458 A1 | 3/2003 | Wilcox et al. | 711/167 |
| 2003/0093614 A1 | 5/2003 | Kohn et al. | 711/105 |
| 2003/0101392 A1 | 5/2003 | Lee | 714/718 |
| 2003/0105932 A1 | 6/2003 | David et al. | 711/167 |
| 2003/0117875 A1 | 6/2003 | Lee et al. | 365/226 |
| 2003/0123389 A1 | 7/2003 | Russell et al. | |
| 2003/0126338 A1 | 7/2003 | Dodd et al. | 710/305 |
| 2003/0131160 A1 | 7/2003 | Hampel et al. | 710/22 |
| 2003/0145163 A1 | 7/2003 | Seo et al. | 711/106 |
| 2003/0158995 A1 | 8/2003 | Lee et al. | 711/105 |
| 2003/0164539 A1 | 9/2003 | Yau | |
| 2003/0182513 A1 | 9/2003 | Dodd et al. | 711/137 |
| 2003/0183934 A1 | 10/2003 | Barrett | |
| 2003/0189868 A1 | 10/2003 | Riesenman et al. | 365/226 |
| 2003/0189870 A1 | 10/2003 | Wilcox | 365/233 |
| 2003/0191888 A1 | 10/2003 | Klein | 711/105 |
| 2003/0191915 A1 | 10/2003 | Saxena et al. | 711/160 |
| 2003/0200382 A1 | 10/2003 | Wells et al. | 711/106 |
| 2003/0200474 A1 | 10/2003 | Li | 713/320 |
| 2003/0205802 A1 | 11/2003 | Segaram et al. | |
| 2003/0223290 A1 | 12/2003 | Park et al. | 365/200 |
| 2003/0227798 A1 | 12/2003 | Pax | 365/189.12 |
| 2003/0229821 A1 | 12/2003 | Ma | 714/8 |
| 2003/0231542 A1 | 12/2003 | Zaharinova-Papazova et al. | 365/226 |
| 2004/0016994 A1 | 1/2004 | Huang | |
| 2004/0034732 A1 | 2/2004 | Valin et al. | 711/4 |
| 2004/0034755 A1 | 2/2004 | LaBerge et al. | |

| Publication No. | Date | Inventor | Class |
|---|---|---|---|
| 2004/0037133 A1 | 2/2004 | Park et al. | 365/202 |
| 2004/0044808 A1 | 3/2004 | Salmon et al. | 710/8 |
| 2004/0047228 A1 | 3/2004 | Chen | 365/232 |
| 2004/0064647 A1 | 4/2004 | DeWhitt et al. | 711/135 |
| 2004/0064767 A1 | 4/2004 | Huckaby et al. | 714/710 |
| 2004/0083324 A1 | 4/2004 | Rabinovitz et al. | |
| 2004/0088475 A1 | 5/2004 | Streif et al. | 711/105 |
| 2004/0117723 A1 | 6/2004 | Foss | 714/805 |
| 2004/0123173 A1 | 6/2004 | Emberling et al. | 714/733 |
| 2004/0125635 A1 | 7/2004 | Kuzmenka | |
| 2004/0133736 A1 | 7/2004 | Kyung | 711/105 |
| 2004/0139359 A1 | 7/2004 | Samson et al. | 713/320 |
| 2004/0145963 A1 | 7/2004 | Byon | 365/233 |
| 2004/0174765 A1 | 9/2004 | Seo et al. | 365/233 |
| 2004/0177079 A1 | 9/2004 | Gluhovsky et al. | 707/100 |
| 2004/0184324 A1 | 9/2004 | Pax | 365/189.12 |
| 2004/0186956 A1 | 9/2004 | Perego et al. | 711/115 |
| 2004/0188704 A1 | 9/2004 | Halbert et al. | 257/145 |
| 2004/0196732 A1 | 10/2004 | Lee | 365/233 |
| 2004/0205433 A1 | 10/2004 | Gower et al. | |
| 2004/0208173 A1 | 10/2004 | Di Gregorio | 370/360 |
| 2004/0225858 A1 | 11/2004 | Brueggen | |
| 2004/0228166 A1 | 11/2004 | Braun et al. | 365/154 |
| 2004/0228203 A1 | 11/2004 | Koo | 365/233 |
| 2004/0230932 A1 | 11/2004 | Dickmann | 716/10 |
| 2004/0236877 A1 | 11/2004 | Burton | |
| 2004/0250989 A1 | 12/2004 | Im et al. | |
| 2004/0256638 A1 | 12/2004 | Perego et al. | 257/200 |
| 2004/0260957 A1 | 12/2004 | Jeddeloh et al. | 713/300 |
| 2004/0264255 A1 | 12/2004 | Royer | 365/189.01 |
| 2004/0268161 A1 | 12/2004 | Ross | 713/300 |
| 2005/0018495 A1 | 1/2005 | Bhakta et al. | 365/19 |
| 2005/0021874 A1 | 1/2005 | Georgiou et al. | 709/250 |
| 2005/0027928 A1 | 2/2005 | Avraham et al. | 711/103 |
| 2005/0028038 A1 | 2/2005 | Pomaranski et al. | 714/42 |
| 2005/0044303 A1 | 2/2005 | Perego et al. | 711/5 |
| 2005/0044305 A1 | 2/2005 | Jakobs et al. | 711/105 |
| 2005/0047192 A1 | 3/2005 | Matsui et al. | 365/145 |
| 2005/0071543 A1 | 3/2005 | Ellis et al. | 711/106 |
| 2005/0078532 A1 | 4/2005 | Ruckerbauer et al. | 365/199 |
| 2005/0081085 A1 | 4/2005 | Ellis et al. | 714/5 |
| 2005/0102590 A1 | 5/2005 | Norris et al. | 714/719 |
| 2005/0108460 A1 | 5/2005 | David | |
| 2005/0127531 A1 | 6/2005 | Tay et al. | |
| 2005/0132158 A1 | 6/2005 | Hampel et al. | 711/167 |
| 2005/0135176 A1 | 6/2005 | Ramakrishnan et al. | |
| 2005/0138267 A1 | 6/2005 | Bains et al. | 711/100 |
| 2005/0138304 A1 | 6/2005 | Ramakrishnan et al. | |
| 2005/0139977 A1 | 6/2005 | Nishio et al. | 257/686 |
| 2005/0141199 A1 | 6/2005 | Chiou et al. | 361/704 |
| 2005/0149662 A1 | 7/2005 | Perego et al. | 711/5 |
| 2005/0152212 A1 | 7/2005 | Yang et al. | 365/233 |
| 2005/0156934 A1 | 7/2005 | Perego et al. | |
| 2005/0166026 A1 | 7/2005 | Ware et al. | 711/167 |
| 2005/0193163 A1 | 9/2005 | Perego et al. | 711/105 |
| 2005/0194676 A1 | 9/2005 | Fukuda et al. | |
| 2005/0194991 A1 | 9/2005 | Dour et al. | 326/30 |
| 2005/0195629 A1 | 9/2005 | Leddige et al. | 365/51 |
| 2005/0201063 A1 | 9/2005 | Lee et al. | |
| 2005/0204111 A1 | 9/2005 | Natarajan | 711/167 |
| 2005/0210196 A1 | 9/2005 | Perego et al. | 711/115 |
| 2005/0223179 A1 | 10/2005 | Perego et al. | 711/154 |
| 2005/0232049 A1 | 10/2005 | Park | |
| 2005/0235119 A1 | 10/2005 | Sechrest et al. | 711/158 |
| 2005/0235131 A1 | 10/2005 | Ware | 711/203 |
| 2005/0237838 A1 | 10/2005 | Kwak et al. | 365/222 |
| 2005/0243635 A1 | 11/2005 | Schaefer | 365/227 |
| 2005/0259504 A1 | 11/2005 | Murtugh et al. | 365/233 |
| 2005/0265506 A1 | 12/2005 | Foss et al. | 375/376 |
| 2005/0269715 A1 | 12/2005 | Yoo | |
| 2005/0278474 A1 | 12/2005 | Perersen et al. | 711/5 |
| 2005/0281096 A1 | 12/2005 | Bhakta et al. | |
| 2005/0281123 A1 | 12/2005 | Bell et al. | 365/230.08 |
| 2005/0285174 A1 | 12/2005 | Saito et al. | 257/296 |
| 2005/0289292 A1 | 12/2005 | Morrow et al. | 711/105 |
| 2005/0289317 A1 | 12/2005 | Liou et al. | 711/170 |
| 2006/0002201 A1 | 1/2006 | Janzen | 365/191 |
| 2006/0010339 A1 | 1/2006 | Klein | 714/5 |
| 2006/0026484 A1 | 2/2006 | Hollums | 714/746 |
| 2006/0038597 A1 | 2/2006 | Becker et al. | |
| 2006/0039204 A1* | 2/2006 | Cornelius | 365/189.05 |
| 2006/0039205 A1* | 2/2006 | Cornelius | 365/189.05 |
| 2006/0041711 A1 | 2/2006 | Miura et al. | 711/103 |
| 2006/0041730 A1 | 2/2006 | Larson | 711/167 |
| 2006/0044909 A1 | 3/2006 | Kinsley et al. | 365/222 |
| 2006/0049502 A1 | 3/2006 | Goodwin et al. | |
| 2006/0050574 A1 | 3/2006 | Streif et al. | 365/194 |
| 2006/0056244 A1 | 3/2006 | Ware | 365/194 |
| 2006/0062047 A1* | 3/2006 | Bhakta et al. | 365/185.09 |
| 2006/0085616 A1 | 4/2006 | Zeighami et al. | 711/167 |
| 2006/0087900 A1 | 4/2006 | Bucksch et al. | |
| 2006/0090031 A1 | 4/2006 | Kirshenbaum et al. | 711/113 |
| 2006/0090054 A1 | 4/2006 | Choi et al. | 711/167 |
| 2006/0106951 A1 | 5/2006 | Bains | 710/5 |
| 2006/0112214 A1 | 5/2006 | Yeh | 711/103 |
| 2006/0112219 A1 | 5/2006 | Chawla et al. | |
| 2006/0117152 A1 | 6/2006 | Amidi et al. | 711/154 |
| 2006/0117160 A1 | 6/2006 | Jackson et al. | 711/170 |
| 2006/0118933 A1 | 6/2006 | Haba | |
| 2006/0129712 A1 | 6/2006 | Raghuram | 710/52 |
| 2006/0129755 A1 | 6/2006 | Raghuram | 711/105 |
| 2006/0136791 A1 | 6/2006 | Nierle | |
| 2006/0149982 A1 | 7/2006 | Vogt | 713/320 |
| 2006/0176744 A1 | 8/2006 | Stave | 365/194 |
| 2006/0179333 A1 | 8/2006 | Brittain et al. | 713/320 |
| 2006/0179334 A1 | 8/2006 | Brittain et al. | 713/320 |
| 2006/0180926 A1 | 8/2006 | Mullen et al. | |
| 2006/0181953 A1 | 8/2006 | Rotenberg et al. | 365/230.06 |
| 2006/0195631 A1 | 8/2006 | Rajamani | |
| 2006/0206738 A1 | 9/2006 | Jeddeloh et al. | 713/320 |
| 2006/0236165 A1 | 10/2006 | Cepulis et al. | |
| 2006/0236201 A1 | 10/2006 | Gower et al. | |
| 2006/0248387 A1 | 11/2006 | Nicholson et al. | 714/22 |
| 2006/0262586 A1 | 11/2006 | Solomon et al. | |
| 2006/0294295 A1 | 12/2006 | Fukuzo | 711/105 |
| 2007/0005998 A1 | 1/2007 | Jain et al. | |
| 2007/0050530 A1 | 3/2007 | Rajan | 711/5 |
| 2007/0058471 A1 | 3/2007 | Rajan et al. | 365/222 |
| 2007/0088995 A1 | 4/2007 | Tsern et al. | 714/724 |
| 2007/0091696 A1 | 4/2007 | Niggemeier et al. | |
| 2007/0106860 A1 | 5/2007 | Foster, Sr. et al. | 711/170 |
| 2007/0136537 A1 | 6/2007 | Doblar et al. | |
| 2007/0162700 A1 | 7/2007 | Fortin et al. | 711/118 |
| 2007/0188997 A1 | 8/2007 | Hockanson et al. | |
| 2007/0192563 A1 | 8/2007 | Rajan et al. | 711/202 |
| 2007/0195613 A1 | 8/2007 | Rajan et al. | 365/189.05 |
| 2007/0204075 A1 | 8/2007 | Rajan et al. | |
| 2007/0216445 A1 | 9/2007 | Raghavan et al. | 326/83 |
| 2007/0247194 A1 | 10/2007 | Jain | 326/87 |
| 2007/0288683 A1 | 12/2007 | Panabaker et al. | 711/101 |
| 2007/0288686 A1 | 12/2007 | Arcedera et al. | 711/103 |
| 2007/0288687 A1 | 12/2007 | Panabaker et al. | 711/103 |
| 2008/0002447 A1 | 1/2008 | Gulachenski et al. | |
| 2008/0010435 A1 | 1/2008 | Smith et al. | |
| 2008/0025108 A1 | 1/2008 | Rajan et al. | 365/189.05 |
| 2008/0025122 A1 | 1/2008 | Schakel et al. | 365/222 |
| 2008/0025136 A1 | 1/2008 | Rajan et al. | 365/230.08 |
| 2008/0025137 A1 | 1/2008 | Rajan et al. | 365/239 |
| 2008/0027697 A1 | 1/2008 | Rajan et al. | 703/14 |
| 2008/0027702 A1 | 1/2008 | Rajan et al. | 703/21 |
| 2008/0027703 A1 | 1/2008 | Rajan et al. | 703/21 |
| 2008/0028135 A1 | 1/2008 | Rajan et al. | |
| 2008/0028136 A1 | 1/2008 | Schakel et al. | 711/106 |
| 2008/0028137 A1 | 1/2008 | Schakel et al. | |
| 2008/0031030 A1 | 2/2008 | Rajan et al. | 365/63 |
| 2008/0031072 A1 | 2/2008 | Rajan et al. | 365/227 |
| 2008/0037353 A1 | 2/2008 | Rajan et al. | 365/227 |
| 2008/0056014 A1 | 3/2008 | Rajan et al. | 365/189.03 |
| 2008/0062773 A1 | 3/2008 | Rajan et al. | 365/189.03 |
| 2008/0065820 A1 | 3/2008 | Gillingham et al. | 711/105 |
| 2008/0082763 A1 | 4/2008 | Rajan et al. | 711/154 |
| 2008/0086588 A1 | 4/2008 | Danilak et al. | |
| 2008/0089034 A1 | 4/2008 | Hoss et al. | |
| 2008/0098277 A1 | 4/2008 | Hazelzet | |
| 2008/0103753 A1 | 5/2008 | Rajan et al. | |
| 2008/0104314 A1 | 5/2008 | Rajan et al. | |
| 2008/0109206 A1 | 5/2008 | Rajan et al. | |
| 2008/0109595 A1 | 5/2008 | Rajan et al. | |

| | | | |
|---|---|---|---|
| 2008/0109597 | A1 | 5/2008 | Schakel et al. |
| 2008/0109598 | A1 | 5/2008 | Schakel et al. |
| 2008/0115006 | A1 | 5/2008 | Smith et al. .................... 713/601 |
| 2008/0120443 | A1 | 5/2008 | Rajan et al. |
| 2008/0120458 | A1 | 5/2008 | Gillingham et al. .......... 711/105 |
| 2008/0123459 | A1 | 5/2008 | Rajan et al. .................... 365/227 |
| 2008/0126687 | A1 | 5/2008 | Rajan et al. |
| 2008/0126688 | A1 | 5/2008 | Rajan et al. |
| 2008/0126689 | A1 | 5/2008 | Rajan et al. |
| 2008/0126690 | A1 | 5/2008 | Rajan et al. .................... 711/105 |
| 2008/0126692 | A1 | 5/2008 | Rajan et al. |
| 2008/0133825 | A1 | 6/2008 | Rajan et al. |
| 2008/0159027 | A1 | 7/2008 | Kim |
| 2008/0170425 | A1 | 7/2008 | Rajan |
| 2008/0239857 | A1 | 10/2008 | Rajan et al. .................... 365/227 |
| 2008/0239858 | A1 | 10/2008 | Rajan et al. .................... 365/227 |
| 2009/0024789 | A1 | 1/2009 | Rajan et al. |
| 2009/0024790 | A1 | 1/2009 | Rajan et al. |
| 2009/0109613 | A1 | 4/2009 | Legen et al. |
| 2009/0216939 | A1 | 8/2009 | Smith et al. |
| 2009/0285031 | A1 | 11/2009 | Rajan et al. |
| 2009/0290442 | A1 | 11/2009 | Rajan |
| 2010/0005218 | A1* | 1/2010 | Gower et al. ..................... 711/5 |
| 2010/0020585 | A1 | 1/2010 | Rajan |
| 2010/0257304 | A1 | 10/2010 | Rajan et al. |
| 2010/0271888 | A1 | 10/2010 | Rajan |
| 2010/0281280 | A1 | 11/2010 | Rajan et al. |

FOREIGN PATENT DOCUMENTS

| | | |
|---|---|---|
| DE | 102004053316 | 5/2006 |
| DE | 102005036528 | 2/2007 |
| EP | 0644547 | 3/1995 |
| JP | 62121978 | 6/1987 |
| JP | 01171047 | 7/1989 |
| JP | 03-029357 | 2/1991 |
| JP | 03029357 | 2/1991 |
| JP | 03/276487 | 12/1991 |
| JP | 03286234 | 12/1991 |
| JP | 07-141870 | 6/1995 |
| JP | 08/077097 | 3/1996 |
| JP | 08077097 | 3/1996 |
| JP | 11-149775 | 6/1999 |
| JP | 2002025255 | 1/2002 |
| JP | 3304893 B2 | 5/2002 |
| JP | 2006236388 | 9/2006 |
| KR | 1020040062717 | 7/2004 |
| WO | WO 95/05676 | 2/1995 |
| WO | WO9900734 | 1/1999 |
| WO | WO01/90900 | 11/2001 |
| WO | WO01/97160 | 12/2001 |
| WO | WO2007002324 | 1/2007 |
| WO | WO2007/028109 | 3/2007 |
| WO | WO 2007/038225 | 4/2007 |
| WO | WO2007/095080 | 8/2007 |
| WO | WO2008063251 | 5/2008 |

OTHER PUBLICATIONS

Final Office Action from U.S. Appl. No. 11/461,430 mailed on Sep. 8, 2008.

Notice of Allowance from U.S. Appl. No. 11/474,075 mailed on Nov. 26, 2008.

Office Action from U.S. Appl. No. 11/474,076 mailed on Nov. 3, 2008.

Office Action from U.S. Appl. No. 11/524,811 mailed on Sep. 17, 2008.

Kellerbauer "Die Schnelle Million," with translation, "The quick million.".

Wu et al., "cNVy: A Non-Volatile, Main Memory Storage System," to appear in ASPLOS VI.

"Using Two Chip Selects to Enable Quad Rank," IP.com PriorArtDatabase, copyright IP.com, Inc. 2004.

"BIOS and Kernel Developer's Guide (BKDG) for AMD Family 10h Processors," AMD, 31116 Rev 3.00, Sep. 7, 2007.

Skerlj et al., "Buffer Device for Memory Modules (DIMM)" Qimonda 2006, p. 1.

Written Opinion from PCT Application No. PCT/US06/24360 mailed on Jan. 8, 2007.

Preliminary Report On Patentability from PCT Application No. PCT/US06/24360 mailed on Jan. 10, 2008.

Written Opinion from International PCT Application No. PCT/US06/34390 mailed on Nov. 21, 2007.

International Search Report from PCT Application No. PCT/US06/34390 mailed on Nov. 21, 2007.

Non-final Office Action from U.S. Appl. No. 11/461,430 mailed on Feb. 19, 2009.

Final Office Action from U.S. Appl. No. 11/461,435 mailed on Jan. 28, 2009.

Non-final Office Action from U.S. Appl. No. 11/461,437 mailed on Jan. 26, 2009.

Non-final Office Action from U.S. Appl. No. 11/939,432 mailed on Feb. 6, 2009.

Wu et al., "eNVy: A Non-Volatile, Main Memory Storage System," ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994).

German Office Action From German Patent Application No. 11 2006 002 300.4-55 Mailed Jun. 5, 2009 (With Translation).

Non-Final Office Action From U.S. Appl. No. 11/461,430 Mailed Feb. 19, 2009.

Final Office Action From U.S. Appl. No. 11/461,435 Mailed Jan. 28, 2009.

Non-Final Office Action From U.S. Appl. No. 11/461,437 Mailed Jan. 26, 2009.

Non-Final Office Action From U.S. Appl. No. 11/461,441 Mailed Apr. 2, 2009.

Non-Final Office Action From U.S. Appl. No. 11/611,374 Mailed Mar. 23, 2009.

Non-Final Office Action From U.S. Appl. No. 11/762,010 Mailed Mar. 20, 2009.

Non-Final Office Action From U.S. Appl. No. 11/939,432 Mailed Feb. 6, 2009.

Non-Final Office Action From U.S. Appl. No. 12/111,819 Mailed Apr. 27, 2009.

Non-Final Office Action From U.S. Appl. No. 12/111,828 Mailed Apr. 17, 2009.

Fang et al., W. Power Complexity Analysis of Adiabatic SRAM, 6th Int. Conference on ASIC, vol. 1, Oct. 2005, pp. 334-337.

Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.

German Office Action From German Patent Application No. 11 2006 001 810.8-55 Mailed Apr. 20, 2009 (With Translation).

Great Britain Office Action from GB Patent Application No. GB0800734.6 Mailed Mar. 1, 2010.

Final Office Action from U.S. Appl. No. 11/461,420 Mailed Apr. 28, 2010.

Notice of Allowance from U.S. Appl. No. 11/553,372 Mailed Mar. 12, 2010.

Notice of Allowance from U.S. Appl. No. 11/553,399 Mailed Mar. 22, 2010.

Non-Final Office Action from U.S. Appl. No. 11/588,739 Mailed Dec. 29, 2009.

Notice of Allowance from U.S. Appl. No. 11/611,374 Mailed Apr. 5, 2010.

Non-Final Office Action from U.S. Appl. No. 11/828,181 Mailed Mar. 2, 2010.

Non-Final Office Action from U.S. Appl. No. 11/828,182 Mailed Mar. 29, 2010.

Final Office Action from U.S. Appl. No. 11/858,518 Mailed Apr. 21, 2010.

Non-Final Office Action from U.S. Appl. No. 11/929,432 Mailed Jan. 14, 2010.

Non-Final Office Action from U.S. Appl. No. 11/929,571 Mailed Mar. 3, 2010.

Non-Final Office Action from U.S. Appl. No. 11/929,631 Mailed Mar. 3, 2010.

Non-Final Office Action from U.S. Appl. No. 11/929,636 Mailed Mar. 9, 2010.

Non-Final Office Action from U.S. Appl. No. 11/929,655 Mailed Mar. 3, 2010.
Notice of Allowance from U.S. Appl. No. 11/939,432 Mailed Dec. 1, 2009.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Great Britain Office Action from GB Patent Application No. GB0803913.3 Mailed Mar. 1, 2010.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Final Office Action from U.S. Appl. No. 11/553,390 Dated Jun. 24, 2010.
Notice of Allowance from U.S. Appl. No. 11/611,374 Dated Jul. 19, 2010.
Final Office Action from U.S. Appl. No. 11/672,921 Dated Jul. 23, 2010.
Final Office Action from U.S. Appl. No. 11/702,960 Dated Jun. 21, 2010.
Notice of Allowance from U.S. Appl. No. 11/762,010 Dated Jul. 2, 2010.
Notice of Allowance from U.S. Appl. No. 11/763,365 Dated Jun. 29, 2010.
Final Office Action from U.S. Appl. No. 11/929,500 Dated Jun. 24, 2010.
Office Action from U.S. Appl. No. 12/574,628 Dated Jun. 10, 2010.
Non-Final Office Action from U.S. Appl. No. 11/461,420 Dated Jul. 23, 2009.
Notice of Allowance from U.S. Appl. No. 11/461,430 Dated Sep. 9, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl.No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Notice of Allowance from U.S. Appl. No. 11/939,432 Dated Sep. 24, 2009.
Non-Final Office Action from U.S. App. No. 11/941,589 Dated Oct. 1, 2009.
Supplemental European Search Report and Search Opinion issued Sep. 21, 2009 in European Application No. 07870726.2, 8 pp.
Wu et al., "eNVy: a Non-Volatile, Main Memory Storage System", ASPLOS-VI Proceedings, Oct. 4-7, 1994, pp. 86-97.
Buffer Device for Memory Modules (DIMM), IP.com Prior Art Database, <URL: http://ip.com/Ipcom/000144850>, Feb. 10, 2007, 1 pg.
German Office Action from German Patent Application No. 11 2006 002 300.4-55 Dated May 11, 2009 (With Translation).
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Notice of Allowance from U.S. Appl. No. 11/553,372 Dated Aug. 4, 2010.
Notice of Allowance from U.S. Appl. No. 11/553,399 Dated Dec. 3, 2010.
Notice of Allowance from U.S. Appl. No. 11/611,374 Dated Oct. 29, 2010.
Final Office Action from Application No. 11/672,924 Dated Sep. 7, 2010.
Non-Final Office Action from U.S. Appl. No. 11/702,981 Dated Mar. 11, 2009.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Oct. 20, 2010.
Non-Final Office Action from U.S. Appl. No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/769,428 Dated Nov. 8, 2010.
Non-Final Office Action from U.S. Appl. No. 12/838,896 Dated Sep. 3, 2010.

* cited by examiner

MEMORY APPARATUS OPERABLE TO PERFORM A POWER-SAVING OPERATION

RELATED APPLICATION

This application is a continuation of commonly-assigned U.S. patent application Ser. No. 11/762,010 entitled "Memory Device with Emulated Characteristics" filed Jun. 12, 2007 by Rajan, et al., which, in turn, is a continuation-in-part of commonly-assigned U.S. patent application Ser. No. 11/461,420 entitled "System and Method for Simulating a Different Number of Memory Circuits" filed Jul. 31, 2006 by Rajan, et al., which are incorporated by reference as if fully set forth herein.

BACKGROUND OF THE INVENTION

1. Technical Field of the Invention

This invention relates generally to digital memory such as used in computers, and more specifically to organization and design of memory modules such as DIMMs.

2. Background Art

Digital memories are utilized in a wide variety of electronic systems, such as personal computers, workstations, servers, consumer electronics, printers, televisions, and so forth. Digital memories are manufactured as monolithic integrated circuits ("ICs" or "chips"). Digital memories come in several types, such as dynamic random access memory (DRAM), static random access memory (SRAM), flash memory, electrically erasable programmable read only memory (EEPROM), and so forth.

In some systems, the memory chips are coupled directly into the system such as by being soldered directly to the system's main motherboard. In other systems, groups of memory chips are first coupled into memory modules, such as dual in-line memory modules (DIMMs), which are in turn coupled into a system by means of slots, sockets, or other connectors. Some types of memory modules include not only tire memory chips themselves, but also some additional logic which interfaces the memory chips to the system. This logic may perform a variety of low level functions, such as buffering or latching signals between the chips and the system, but it may also perform higher level functions, such as telling the system what are the characteristics of the memory chips. These characteristics may include, for example, memory capacity, speed, latency, interface protocol, and so forth.

Memory capacity requirements of such systems are increasing rapidly. However, other industry trends such as higher memory bus speeds, small form factor machines, etc. are reducing the number of memory module slots, sockets, connectors, etc. that are available in such systems. There is, therefore, pressure for manufacturers to use large capacity memory modules in such systems.

However, there is also an exponential relationship between a memory chip's capacity and its price. As a result, large capacity memory modules may be cost prohibitive in some systems.

What is needed, then, is an effective way to make use of low cost memory chips in manufacturing high capacity memory modules.

SUMMARY

A memory subsystem is provided including an interface circuit adapted for communication with a system and a majority of address or control signals of a first number of memory circuits. The interface circuit includes emulation logic for emulating at least one memory circuit of a second number.

DETAILED DESCRIPTION

The invention will be understood more fully from the detailed description given below and from the accompanying drawings of embodiments of the invention which, however, should not be taken to limit the invention to the specific embodiments described, but are for explanation and understanding only.

Figure 1:
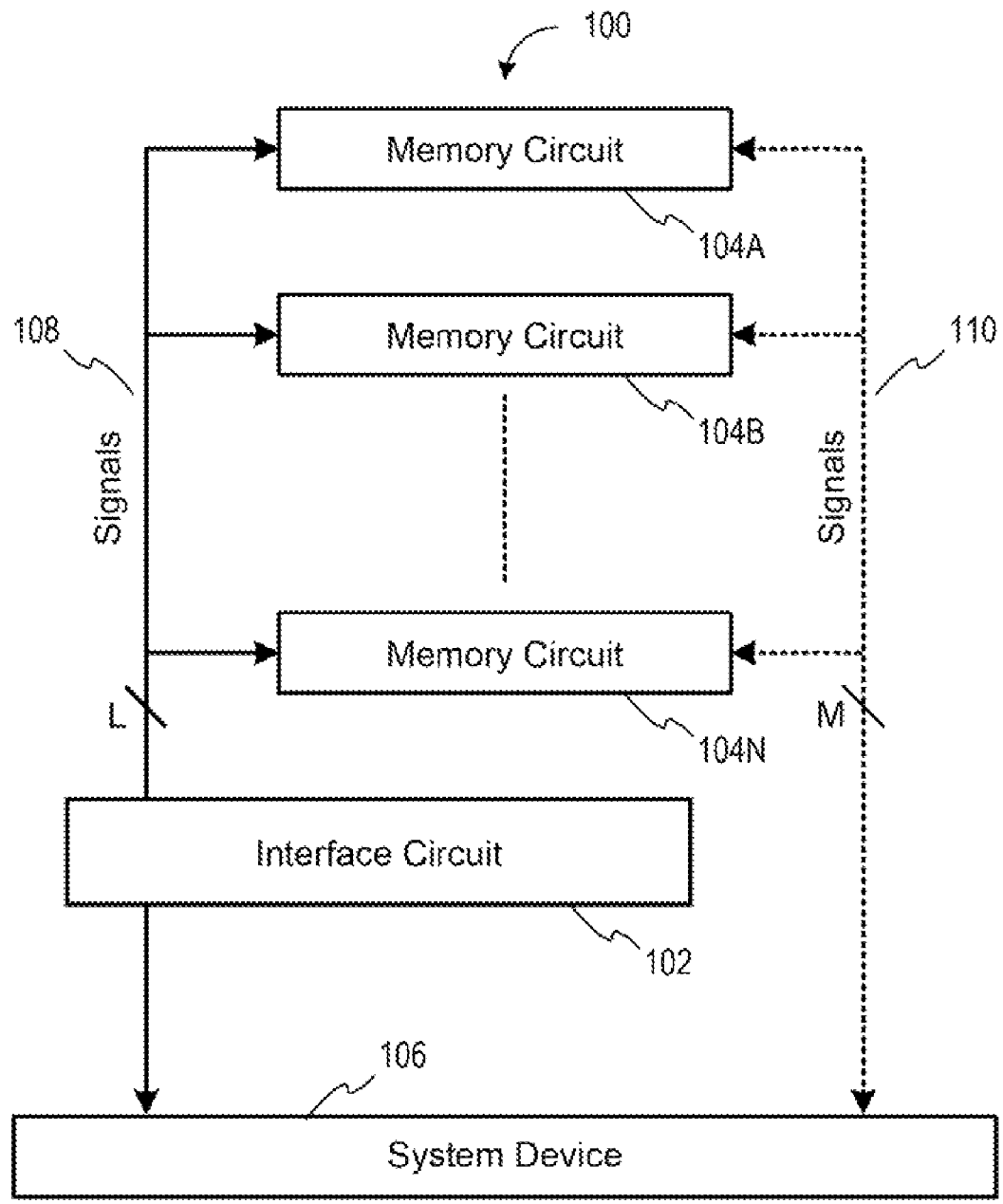
FIG. 1 shows a system coupled to multiple memory circuits and an interface circuit according to one embodiment of this invention.

FIG. 1 illustrates a system 100 including a system device 106 coupled to an interlace circuit 102, which is in turn coupled to a plurality of physical memory circuits 104A-N. The physical memory circuits may be any type of memory circuits. In some embodiments, each physical memory circuit is a separate memory chip. For example, each may be a DDR2 DRAM. In some embodiments, the memory circuits may be symmetrical, meaning each has the same capacity, type, speed, etc., while in other embodiments they may be asymmetrical. For ease of illustration only, three such memory circuits are shown, but actual embodiments may use any plural number of memory circuits. As will be discussed below, the memory chips may optionally be coupled to a memory module (not shown), such as a DIMM.

The system device may be any type of system capable of requesting and/or initiating a process that results in an access of the memory circuits. The system may include a memory controller (not shown) through which it accesses the memory circuits.

The interface circuit may include any circuit or logic capable of directly or indirectly communicating with the memory circuits, such as a buffer chip, advanced, memory buffer (AMB) chip, etc. The interface circuit interfaces a plurality of signals 108 between the system device and the memory circuits. Such signals may include, for example, data signals, address signals, control signals, clock signals, and so forth. In some embodiments, all of the signals communicated between the system device and the memory circuits are communicated via the interface circuit. In other embodiments, some other signals 110 are communicated directly between the system device (or some component thereof, such as a memory controller, an AMB, or a register) and the memory circuits, without passing through the interface circuit. In some such embodiments, the majority of signals are communicated via the interface circuit, such that L>M.

As will be explained in greater detail below, the interface circuit presents to the system device an interface to emulated memory devices which differ in some aspect from the physical memory circuits which are actually present. For example, the interface circuit may tell the system device that the number of emulated memory circuits is different than the actual number of physical memory circuits. The terms "emulating", "emulated", "emulation", and the like will be used in this disclosure to signify emulation, simulation, disguising, transforming, converting, and the like, which results in at least one characteristic of the memory circuits appearing to the system device to be different than the actual, physical characteristic. In some embodiments, the emulated characteristic may be electrical in nature, physical in nature, logical in nature, pertaining to a protocol, etc. An example of an emulated electrical characteristic might be a signal, or a voltage level. An example of an emulated physical characteristic might be a number of pins or wires, a number of signals, or a memory capacity. An example of an emulated protocol characteristic might be a timing, or a specific protocol such as DDR3.

In the case of an emulated signal such signal may be a control signal such as an address signal, a data signal, or a control signal associated with an activate operation, precharge operation, write operation, mode register read operation, refresh operation, etc. The interface circuit may emulate the number of signals, type of signals, duration of signal assertion, and so forth. It may combine multiple signals to emulate another signal.

The interface circuit may present to the system device an emulated interface to e.g. DDR3 memory, while the physical memory chips are, in fact, DDR2 memory. The interface circuit may emulate an interface to one version of a protocol such as DDR2 with 5-5-5 latency timing, while the physical memory chips are built to another version of the protocol such as DDR2 with 3-3-3 latency timing. The interface circuit may emulate an interface to a memory having a first capacity that is different than the actual combined capacity of the physical memory chips.

An emulated timing may relate to latency of e.g. a column address strobe (CAS) latency, a row address to column address latency (tRCD), a row precharge latency (tRP), an activate to precharge latency (tRAS), and so forth. CAS latency is related to the timing of accessing a column of data. tRCD is the latency required between the row address strobe (RAS) and CAS. tRP is the latency required to terminate an open row and open access to the next row. tRAS is the latency required to access a certain row of data between an activate operation and a precharge operation.

The interface circuit may be operable to receive a signal from the system device and communicate the signal to one or more of the memory circuits after a delay (which, may be hidden from the system device). Such delay may be fixed, or in some embodiments it may be variable. If variable, the delay may depend on e.g. a function of the current signal or a previous signal, a combination of signals, or the like. The delay may include a cumulative delay associated with any one or more of the signals. The delay may result in a time shift of the signal forward or backward in time with respect to other signals. Different delays may be applied to different signals. The interface circuit may similarly be operable to receive a signal from a memory circuit and communicate the signal to the system device after a delay.

The interface circuit may take the form of or incorporate, or be incorporated into, a register, an AMB, a buffer, or the like, and may comply with Joint Electron Device Engineering Council (JEDEC) standards, and may have forwarding, storing, and/or buffering capabilities.

In some embodiments, the interface circuit may perform operations without the system device's knowledge. One particularly useful such operation is a power-saving operation. The interface circuit may identify one or more of the memory circuits which are not currently being accessed by the system device, and perform the power saving operation on those. In one such embodiment, the identification may involve determining whether any page (or other portion) of memory is being accessed. The power saving operation may be a power down operation, such as a precharge power down operation.

The interface circuit may include one or more devices which together perform the emulation and related operations. The interface circuit may be coupled or packaged with the memory devices, or with the system device or a component thereof or separately. In one embodiment, the memory circuits and the interface circuit are coupled to a DIMM.

Figure 2:
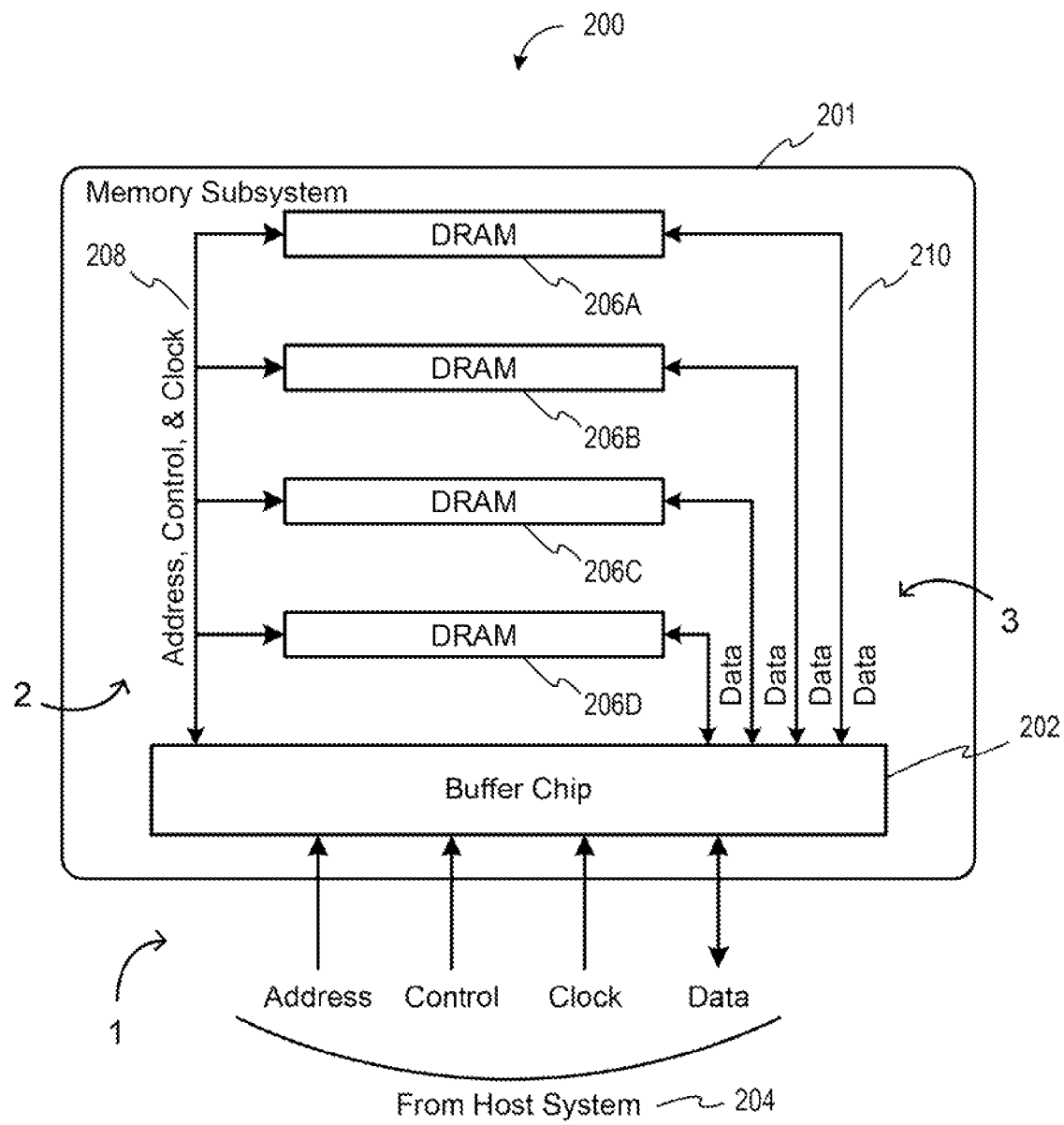
FIG. 2 shows a buffered stack of DRAM circuits each having a dedicated data path from the buffer chip and sharing a single address, control, and clock bus.

FIG. 2 illustrates one embodiment of a system 200 including a system device (e.g. host system 204, etc.) which communicates address, control, clock, and data signals with a memory subsystem 201 via an interface.

The memory subsystem includes a buffer chip 202 which presents the host system with emulated interface to emulated memory, and a plurality of physical memory circuits which, in the example shown, are DRAM chips 206A-D. In one embodiment, the DRAM chips are stacked, and the buffer chip is placed electrically between them and die host system. Although the embodiments described here show the stack, consisting of multiple DRAM circuits, a stack may refer to any collection of memory circuits (e.g. DRAM circuits, flash memory circuits, or combinations of memory circuit technologies, etc.).

The buffer chip buffers communicates signals between the host system and the DRAM chips, and presents to the host system an emulated interface to present the memory as though it were a smaller number of larger capacity DRAM chips, although in actuality there is a larger number of smaller capacity DRAM chips in the memory subsystem. For example, there may be eight 512 Mb physical DRAM chips, but the buffer chip buffers and emulates them to appear as a single 4 Gb DRAM chip, or as two 2 Gb DRAM chips. Although the drawing shows four DRAM chips, this is for ease of illustration only; the invention is, of course, not limited to using four DRAM chips.

In the example shown, the buffer chip is coupled to send address, control, and clock signals 208 to the DRAM chips via a single, shared address, control, and clock bus, but each DRAM chip has its own, dedicated data path for sending and receiving data signals 210 to/from the buffer chip.

Throughout this disclosure, the reference number 1 will be used to denote the interface between the host system and the buffer chip, the reference number 2 will be used to denote the address, control, and clock interface between the buffer chip and the physical memory circuits, and the reference number 3 will be used to denote the data interface between the buffer chip and the physical memory circuits, regardless of the specifics of how any of those interfaces is implemented in the various embodiments and configurations described below. In the configuration shown in FIG. 2, there is a single address, control, and clock interface channel 2 and four data interface channels 3; this implementation may thus be said to have a "1A4D" configuration (wherein "1A" means one address, control, and clock channel in interface 2, and "4D" means four data channels in interface 3).

In the example shown, the DRAM chips are physically arranged on a single side of the buffer chip. The buffer chip may, optionally, be a part of the stack of DRAM chips, and may optionally be the bottommost chip in the stack. Or, it may be separate from the stack.

Figure 3:
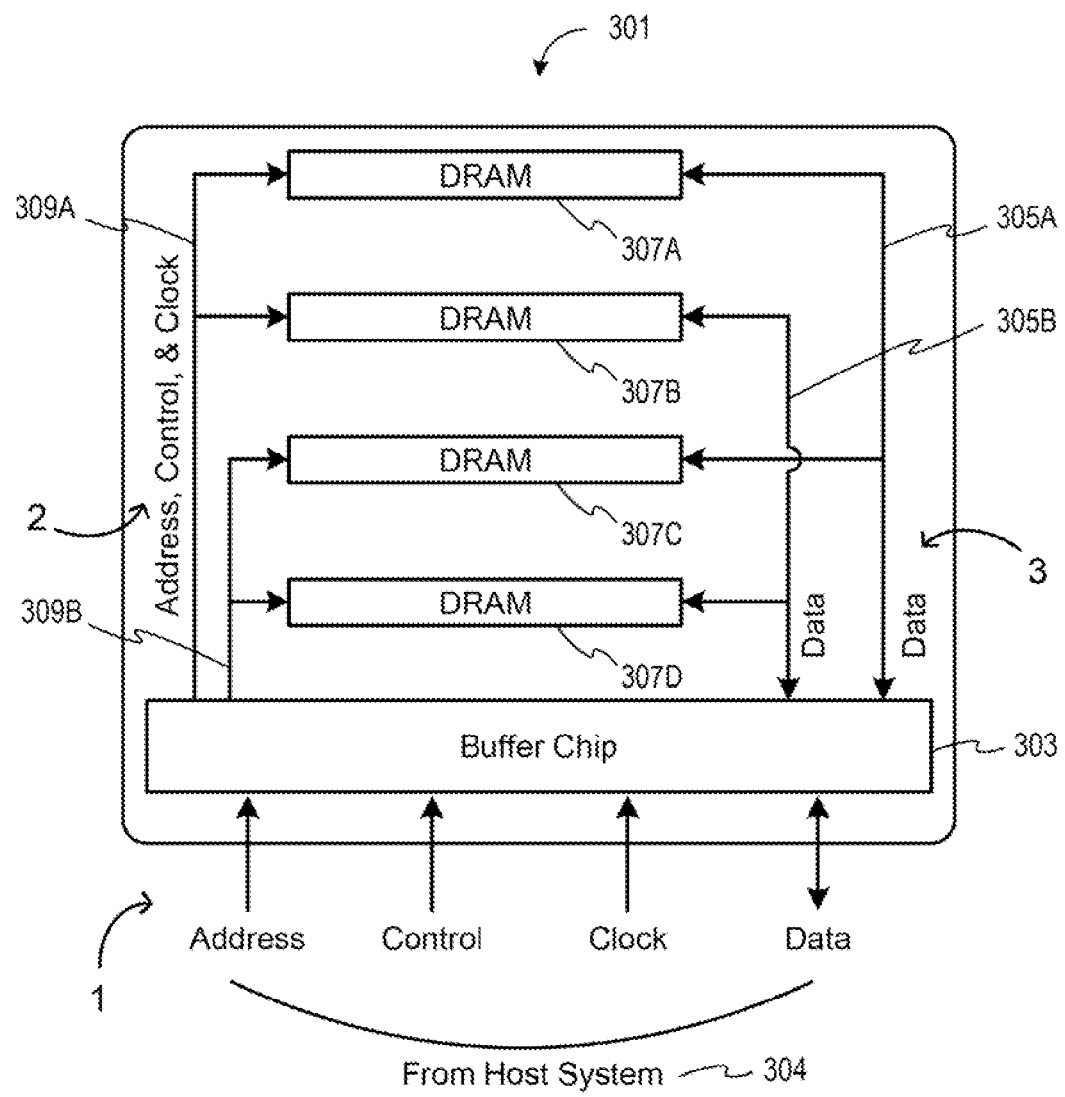
FIG. 3 shows a buffered stack of DRAM circuits having two address, control, and clock busses and two data busses.

FIG. 3 illustrates another embodiment of a system 301 in which the buffer chip 303 is interfaced to a host system 304 and is coupled to the DRAM chips 307A-307D somewhat differently than in the system of FIG. 2. There are a plurality of shared address, control, and clock busses 309A and 309B, and a plurality of shared data busses 305A and 305B. Each shared bus has two or more DRAM chips coupled to it. As shown, the sharing need not necessarily be the same in the data busses as it is in the address, control, and clock busses. This embodiment has a "2A2D" configuration.

Figure 4:
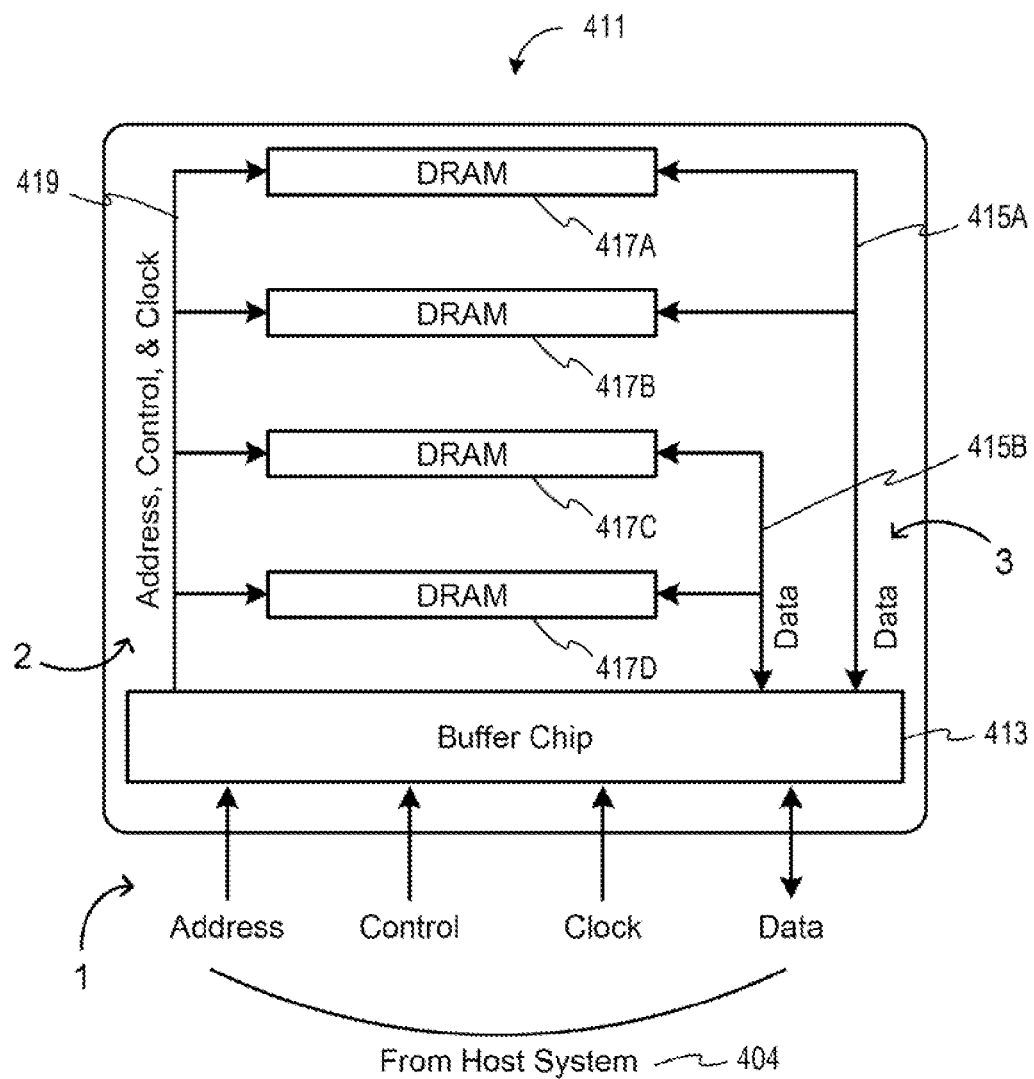
FIG. 4 shows a buffered stack of DRAM circuits having one address, control, and clock bus and two data busses.

FIG. 4 illustrates another embodiment of a system 411 in which the buffer chip 413 is interfaced to a host system 404 and is coupled to the DRAM chips 417A-417D somewhat differently than in the system of FIGS. 2 or 3. There is a shared address, control, and clock bus 419, and a plurality of shared data busses 415A and 41.5B. Each shared bus has two or more DRAM chips coupled to it. This implementation has a "1A2D" configuration.

Figure 5:
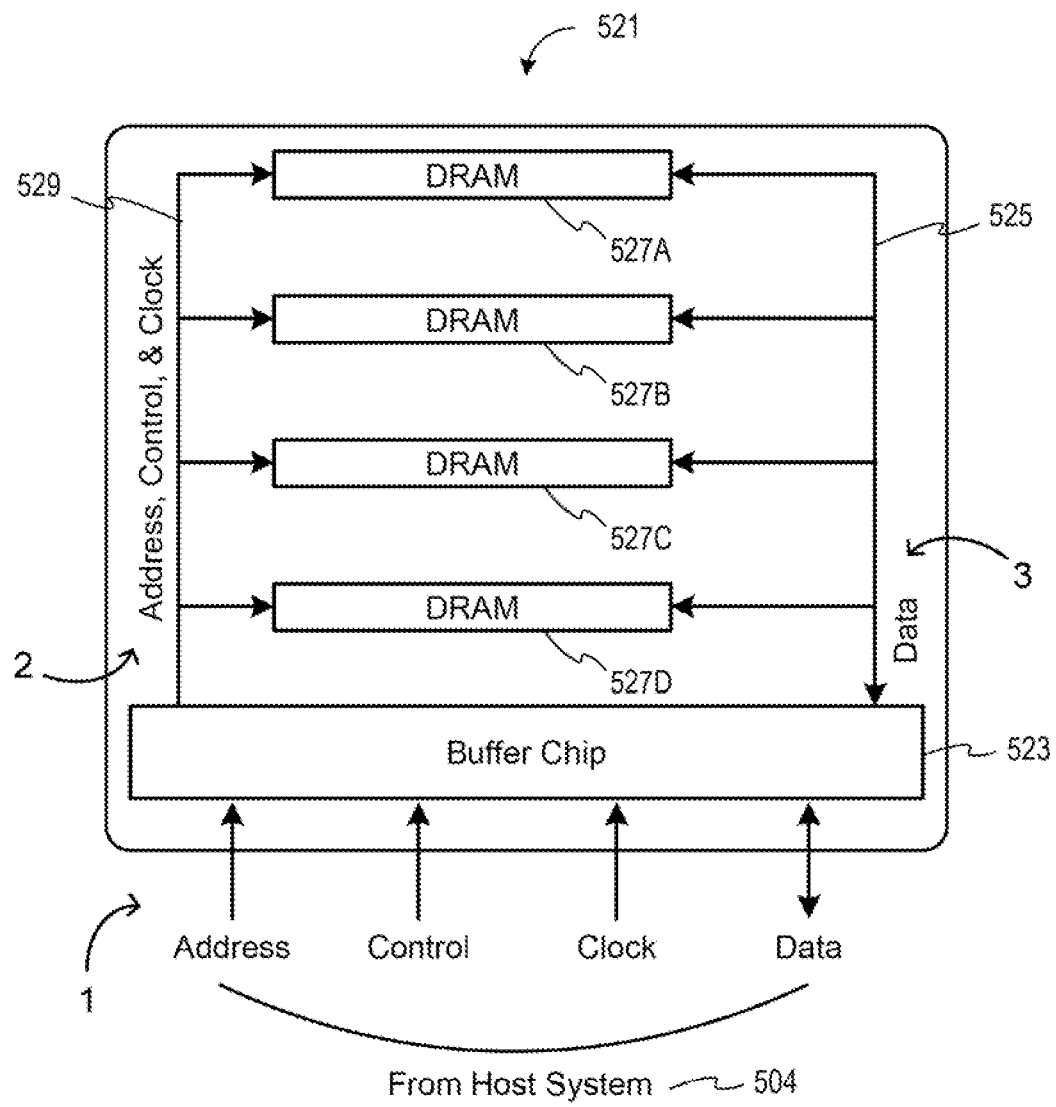
FIG. 5 shows a buffered stack of DRAM circuits having one address, control, and clock bus and one data bus.

FIG. 5 illustrates another embodiment of a system 521 in which the buffer chip 523 is interfaced to a host system 504 and is coupled to the DRAM chips 527A-527D somewhat differently than in the system of FIGS. 2 through 4. There is a shared address, control, and clock bus 529, and a shared data bus 525. This implementation has a "1A1D" configuration.

Figure 6:
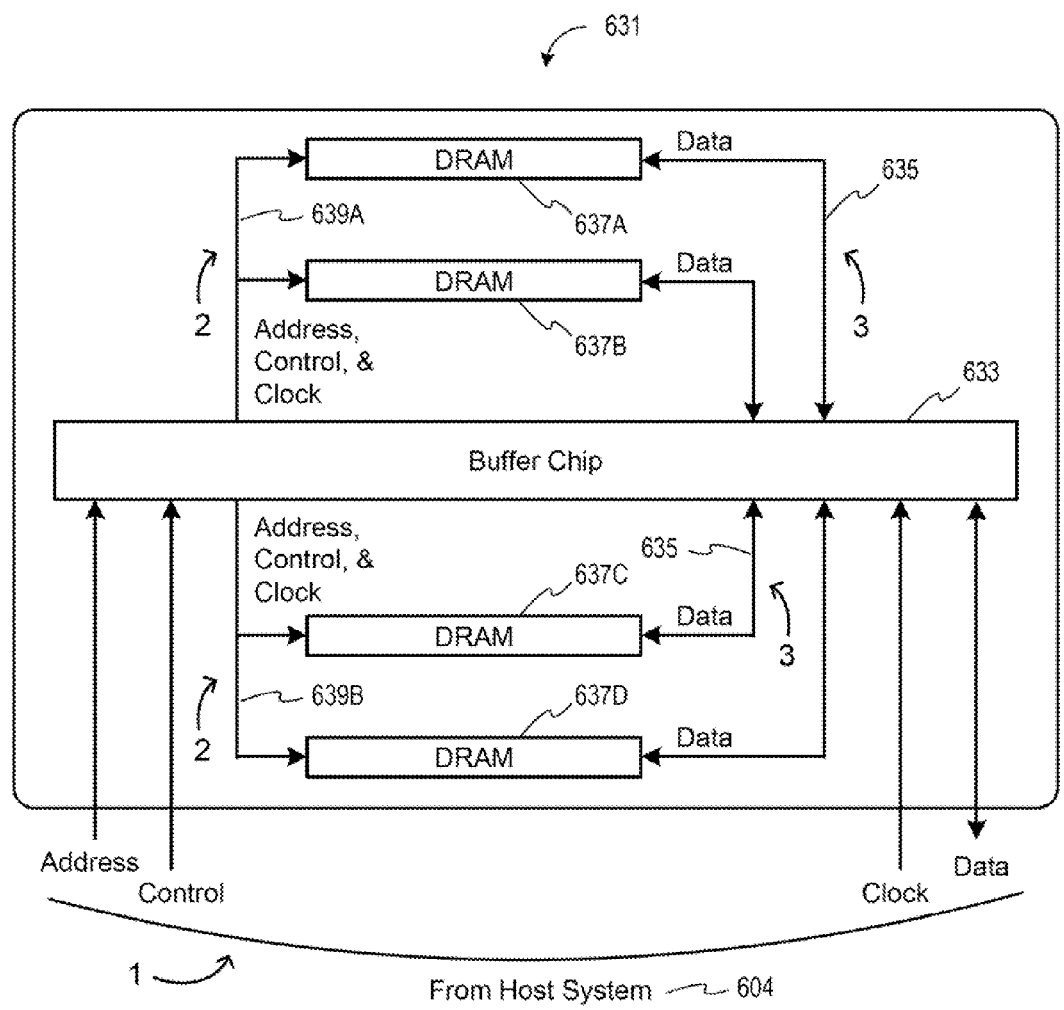
FIG. 6 shows a buffered stack of DRAM circuits in which the buffer chip is located in the middle of the stack of DRAM chips.

FIG. 6 illustrates another embodiment of a system 631 in which the buffer chip 633 is interfaced to a host system 604 and is coupled to the DRAM chips 637A-637D somewhat differently than in the system of FIGS. 2 through 5. There is a plurality of shared address, control, and clock busses 639A and 639B, and a plurality of dedicated data paths 635. Each shared bus has two or more DRAM chips coupled to it. Further, in the example shown, the DRAM chips are physically arranged on both sides of the butler chip. There may be, for example, sixteen DRAM chips, with the eight DRAM chips on each side of the buffer chip arranged in two stacks of four chips each. This implementation has a "2A4D" configuration.

FIGS. 2 through 6 are not intended to be an exhaustive listing of all possible permutations of data paths, busses, and buffer chip configurations, and are only illustrative of some ways in which the host system device can be in electrical contact only with the load of the buffer chip and thereby be isolated from whatever physical memory circuits, data paths, busses, etc. exist on the (logical) other side of the butler chip.

Figure 7:
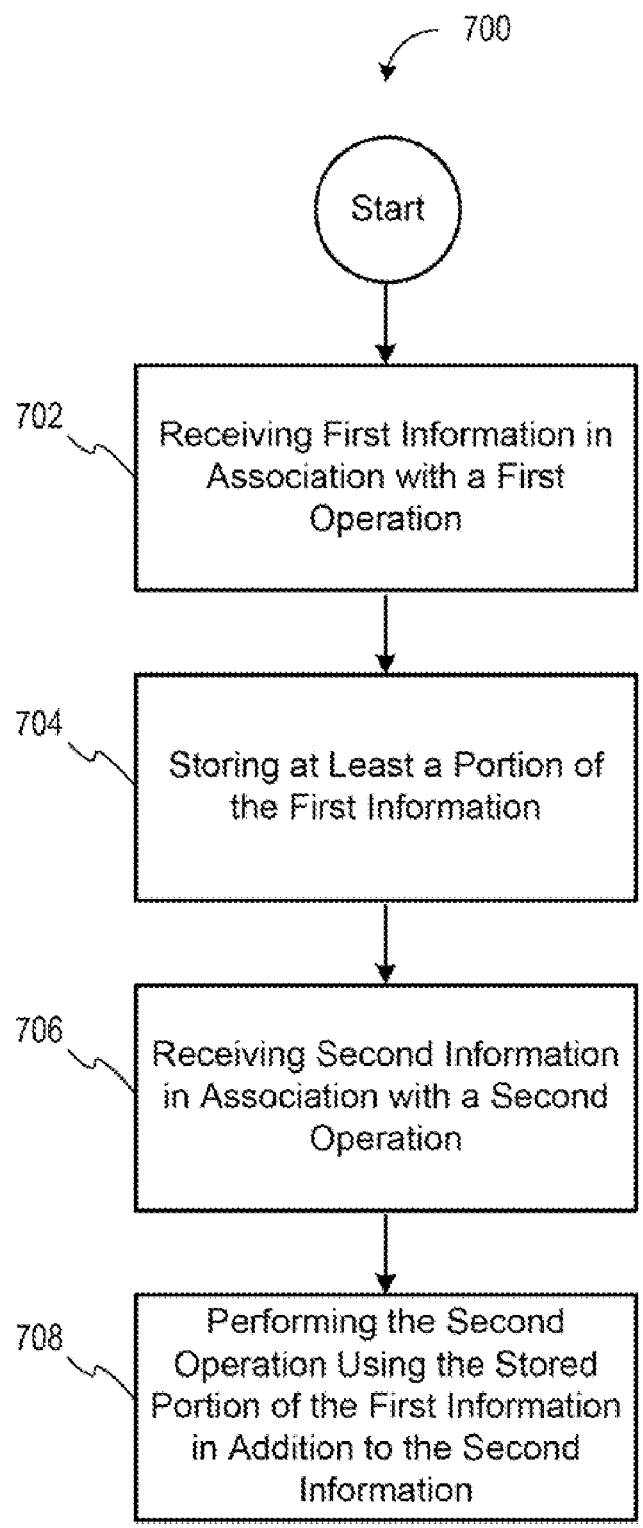
FIG. 7 is a flow chart showing one method of storing information.

FIG. 7 illustrates one embodiment of a method 700 for storing at least a portion of information received in association with a first operation, for use in performing a second operation. Such a method may be practiced in a variety of systems, such as, but not limited to, those of FIGS. 1-6. For example, the method may be performed by the interface circuit of FIG. 1 or the buffer chip of FIG. 2.

Initially, first information is received (702) in association with a first operation to be performed on at least one of the memory circuits (DRAM chips). Depending on the particular implementation, the first information may be received prior to, simultaneously with, or subsequent to the instigation of the first operation. The first operation may be, for example, a row operation, in which case the first information may include e.g. address values received by the buffer chip via the address bus from the host system. At least a portion of the first information is then stored (704).

The buffer chip also receives (706) second information associated with a second operation. For convenience, this receipt is shown as being after the storing of the first information, but it could also happen prior to or simultaneously with the storing. The second operation may be, for example, a column operation.

Then, the buffer chip performs (708) the second operation, utilizing the stored portion of the first information, and the second information.

If the buffer chip is emulating a memory device which has a larger capacity than each of the physical DRAM chips in the stack, the buffer chip may receive from the host system's memory controller more address bits than are required to address any given one of the DRAM chips. In this instance, the extra address bits may be decoded by the buffer chip to individually select the DRAM chips, utilizing separate chip select signals (not shown) to each of the DRAM chips in the stack.

For example, a stack of four x4 1 Gb DRAM chips behind the buffer chip may appear to the host system as a single x4 4 Gb DRAM circuit, in which case the memory controller may provide sixteen row address bits and three bank address bits during a row operation (e.g. an activate operation), and provide eleven column address bits and three bank address bits during a column operation (e.g. a read or write operation). However, the individual DRAM chips in the stack may require only fourteen row address bits and three bank address bits for a row operation, and eleven column address bits and three bank address bits during a column operation. As a result, during a row operation (the first operation in the method 702), the buffer chip may receive two address bits more than are needed by any of the DRAM chips. The buffer chip stores (704) these two extra bits during the row operation (in addition to using them to select the correct one of the DRAM chips), then uses them later, during the column operation, to select the correct one of the DRAM chips.

The mapping between a system address (from the host system to the buffer chip) and a device address (front the buffer chip to a DRAM chip) may be performed in various manners. In one embodiment, lower order system row address and bank address bits may be mapped directly to the device row address and bank address bits, with the most significant system row address bits (and, optionally, the most significant bank address bits) being stored for use in the subsequent column operation. In one such embodiment, what is stored is the decoded version of those bits; in other words, the extra bits may be stored either prior to or after decoding. The stored bits may be stored, for example, in an internal lookup table (not shown) in the buffer chip, for one or more clock cycles.

As another example, the buffer chip may have four 512 Mb DRAM chips with which it emulates a single 2 Gb DRAM chip. The system will present fifteen row address bits, from which the buffer chip may use the fourteen low order bits (or, optionally, some other set of fourteen bits) to directly address the DRAM chips. The system will present three bank address bits, from which the buffer chip may use the two low order bits (or, optionally, some other set of two bits) to directly address the DRAM chips. During a row operation, the most significant bank address bit (or other unused bit) and the most significant row address bit (or other unused bit) are used to generate the four DRAM chip select signals, and are stored for later reuse. And during a subsequent column operation, the stored bits are again used to generate the four DRAM chip select signals. Optionally, the unused bank address is not stored during the row operation, as it will be re-presented during the subsequent column operation.

As yet another example, addresses may be mapped between four 1 Gb DRAM circuits to emulate a single 4 Gb DRAM circuit. Sixteen row address bits and three bank address bits come from the host system, of which the low order fourteen address bits and all three bank address bits are mapped directly to the DRAM circuits. During a row operation, the two most significant row address bits are decoded to generate four chip select signals, and are stored using tire bank address bits as the index. During the subsequent column operation, the stored row address bits are again used to generate the four chip select signals.

A particular mapping technique may be chosen, to ensure that there are no unnecessary combinational logic circuits in the critical timing path between the address input pins and address output pins of the buffer chip. Corresponding combinational logic circuits may instead be used to generate the individual chip select signals. This may allow the capacitive loading on the address outputs of the buffer chip to be much higher than the loading on the individual chip select signal outputs of the buffer chip.

In another embodiment, the address mapping may be performed by the buffer chip using some of the bank address signals from the host system to generate the chip select signals. The buffer chip may store the higher order row address bits during a row operation, using the bank address as the index, and then use the stored address bits as part of the DRAM circuit bank address during a column operation.

For example, four 512 Mb DRAM chips maybe used in emulating a single 2 Gb DRAM. Fifteen row address bits come from the host system, of which the low order fourteen are mapped directly to the DRAM chips. Three bank address bits come from the host system, of which the least significant bit is used as a DRAM circuit bank address bit for the DRAM chips. The most significant row address bit may be used as an additional DRAM circuit bank address bit. During a row operation, the two most significant bank address bits are decoded to generate the four chip select signals. The most significant row address bit may be stored during the row operation, and reused during the column operation with the least significant bank address bit, to form the DRAM circuit bank address.

The column address from the host system memory controller may be mapped directly as the column address to the DRAM chips in the stack, since each of the DRAM chips may have the same page size, regardless any differences in the capacities of the (asymmetrical) DRAM chips.

Optionally, address bit A[10] may be used by the memory controller to enable or disable auto-precharge during a column operation, in which case the buffer chip may forward that bit to the DRAM circuits without any modification during a column operation.

In various embodiments, it may be desirable to determine whether the simulated DRAM circuit behaves according to a desired DRAM standard or other design specification. Behavior of many DRAM circuits is specified by the JEDEC standards, and it may be desirable to exactly emulate a particular JEDEC standard DRAM. The JEDEC standard defines control signals that a DRAM circuit must accept and the behavior of the DRAM circuit as a result of such control signals. For example, the JEDEC specification for DDR2 DRAM is known as JESD79-2B. If it is desired to determine whether a standard is met, the following algorithm may be used. Using a set of software verification tools, it checks for formal verification of logic, that protocol behavior of the simulated DRAM circuit is the same as the desired standard or other design specification. Examples of suitable verification tools include: Magellan, supplied by Synopsys, Inc. of 700 E. Middlefield Rd., Mt. View, Calif. 94043; Incisive, supplied by Cadence Design Systems, Inc., of 2655 Sealy Ave., San Jose, Calif. 95134; tools supplied by Jasper Design Automation, Inc. of 100 View St. #100, Mt. View, Calif. 94041; Verix, supplied by Real Intent, Inc., of 505 N. Mathilda Ave. #210, Sunnyvale, Calif. 94085; 0-In, supplied by Mentor Graphics Corp. of 8005 SW Boeckman Rd., Wilsonville, Oreg. 97070; and others. These software verification tools use written assertions that correspond to the rules established by the particular DRAM protocol and specification. These written assertions are further included in the code that forms the logic description for the buffer chip. By writing assertions that correspond to the desired behavior of the emulated DRAM circuit, a proof may be constructed that determines whether the desired design requirements are met.

For instance, an assertion may be written that no two DRAM control signals are allowed to be issued to an address, control, and clock bus at the same time. Although one may know which of the various buffer chip/DRAM stack configurations and address mappings (such as those described above) are suitable, the verification process allows a designer to prove that the emulated DRAM circuit exactly meets the required standard etc. If, for example, an address mapping that uses a common bus for data and a common bus for address, results in a control and clock bus that does not meet a required specification, alternative designs for buffer chips with other bus arrangements or alternative designs for the sideband signal interconnect between two or more buffer chips may be used and tested for compliance. Such sideband signals convey the power management signals, for example.

Figure 8:
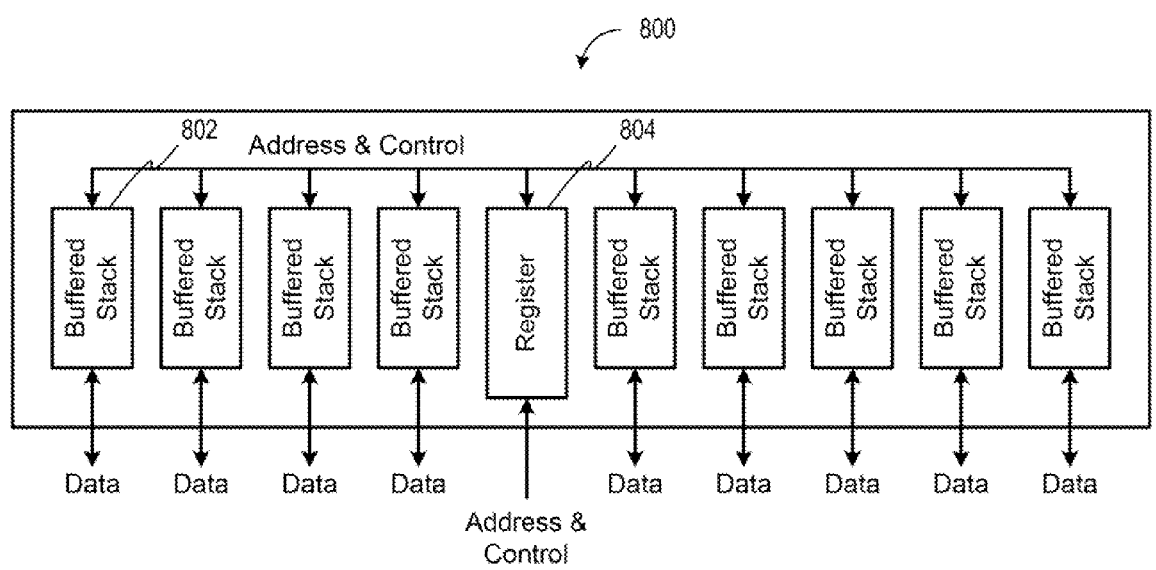
FIG. 8 shows a high capacity DIMM using buffered stacks of DRAM chips according to one embodiment of this invention.

FIG. 8 illustrates a high capacity DIMM 800 using a plurality of buffered stacks of DRAM circuits 802 and a register device 804, according to one embodiment of this invention. The register performs the addressing and control of the buffered stacks. In some embodiments, the DIMM may be an FB-DIMM, in which case the register is an AMB. In one embodiment the emulation is performed at the DIMM level.

Figure 9:
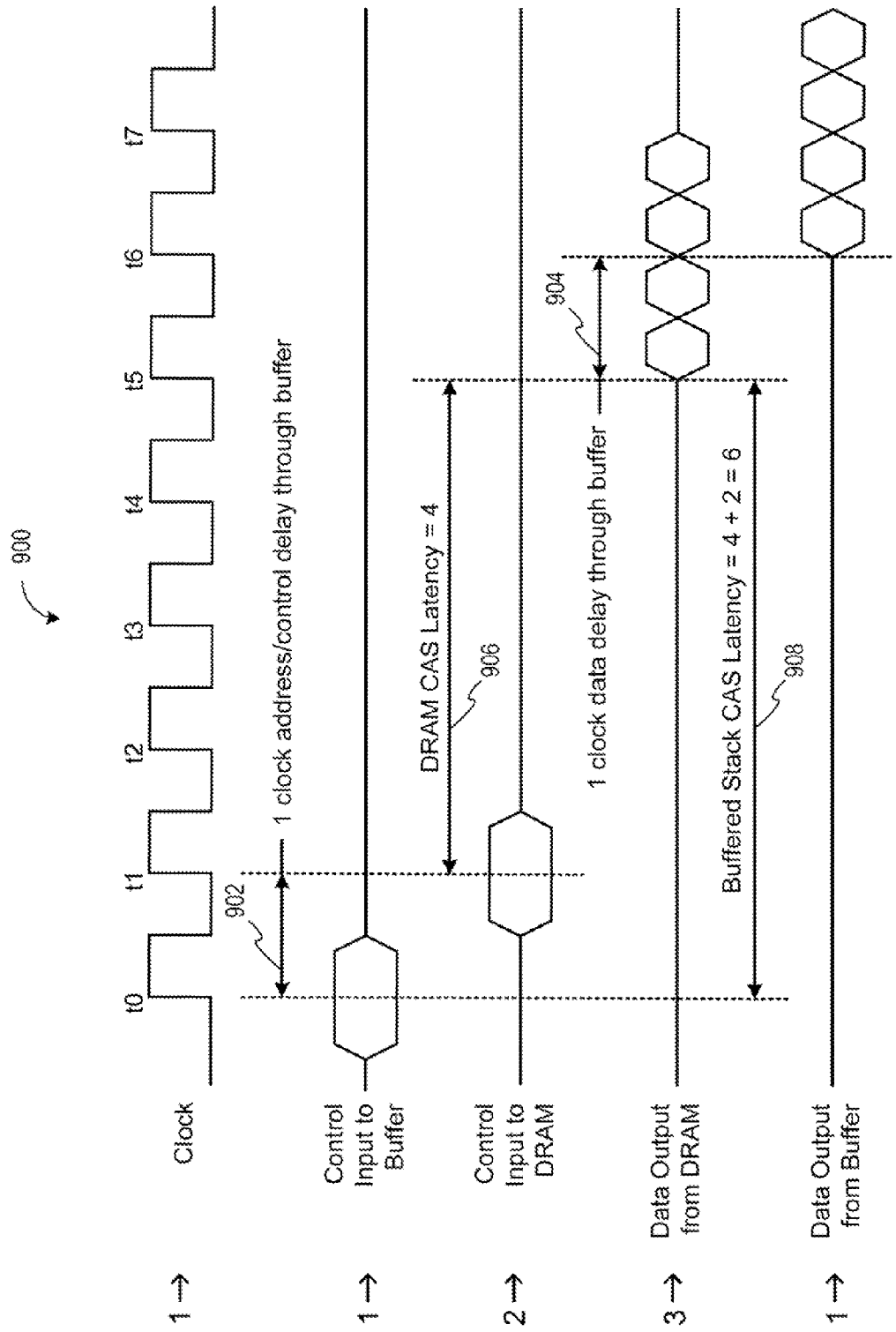
FIG. 9 is a timing diagram showing one embodiment of how the buffer chip makes a buffered stack of DRAM circuits appear to the system or memory controller to use longer column address strobe (CAS) latency DRAM chips than is actually used by the physical DRAM chips.

FIG. 9 is a timing diagram illustrating a timing design 900 of a buffer chip which makes a buffered stack of DRAM chips mimic a larger DRAM circuit having longer CAS latency, in accordance with another embodiment of this invention. Any delay through a buffer chip may be made transparent to the host system's memory controller, by using such a method. Such a delay may be a result of the buffer chip being located electrically between the memory bus of the host system and the stacked DRAM circuits, since some or all of the signals that connect the memory bus to the DRAM circuits pass through the buffer chip. A finite amount of time may be needed for these signals to traverse through the buffer chip. With the exception of register chips and AMBs, industry standard memory protocols may not comprehend the buffer chip that sits between the memory bus and the DRAM chips. Industry standards narrowly define the properties of a register chip and an AMB, but not the properties of the buffer chip of this embodiment. Thus, any signal delay caused by the buffer chip may cause a violation of the industry standard protocols.

In one embodiment, the buffer chip may cause a one-half clock cycle delay between the buffer chip receiving address and control signals from the host system memory controller (or, optionally, from a register chip or an AMB), and the address and control signals being valid at the inputs of the stacked DRAM circuits. Data signals may also have a one-half clock cycle delay in either direction to/from the host system. Other amounts of delay are, of course, possible, and the half-clock cycle example is for illustration only.

The cumulative delay through the buffer chip is the sum of a delay of the address and control signals and a delay of the data signals. FIG. 9 illustrates an example where the buffer chip is using DRAM chips having a native CAS latency of i clocks, and the buffer chip delay is j clocks, thus the buffer chip emulates a DRAM having a CAS latency of i+j clocks. In the example shown, the DRAM chips have a native CAS latency 906 of four clocks (from t1 to t5), and the total latency through the buffer chip is two clocks (one clock delay 902 from t0 to t1 for address and control signals, plus one clock delay 904 from t5 to t6 for data signals), and the buffer chip emulates a DRAM having a six clock CAS latency 908.

In FIG. 9 (and other timing diagrams), the reference numbers 1, 2, and/or 3 at the left margin indicate which of the interfaces correspond to the signals or values illustrated on the associated waveforms. For example, in FIG. 9; the "Clock" signal shown as a square wave on the uppermost waveform is indicated as belonging to the interface 1 between the host system and the buffer chip; the "Control Input to Buffer" signal is also part of the interface 1; the "Control Input to DRAM" waveform is part of the interface 2 from the buffer chip to the physical memory circuits; the "Data Output from DRAM" waveform is part of the interface 3 from the physical memory circuits to the butter chip; and the "Data Output from Buffer" shown in the lowermost waveform is part of the interface 1 from the buffer chip to the host system.

Figure 10:
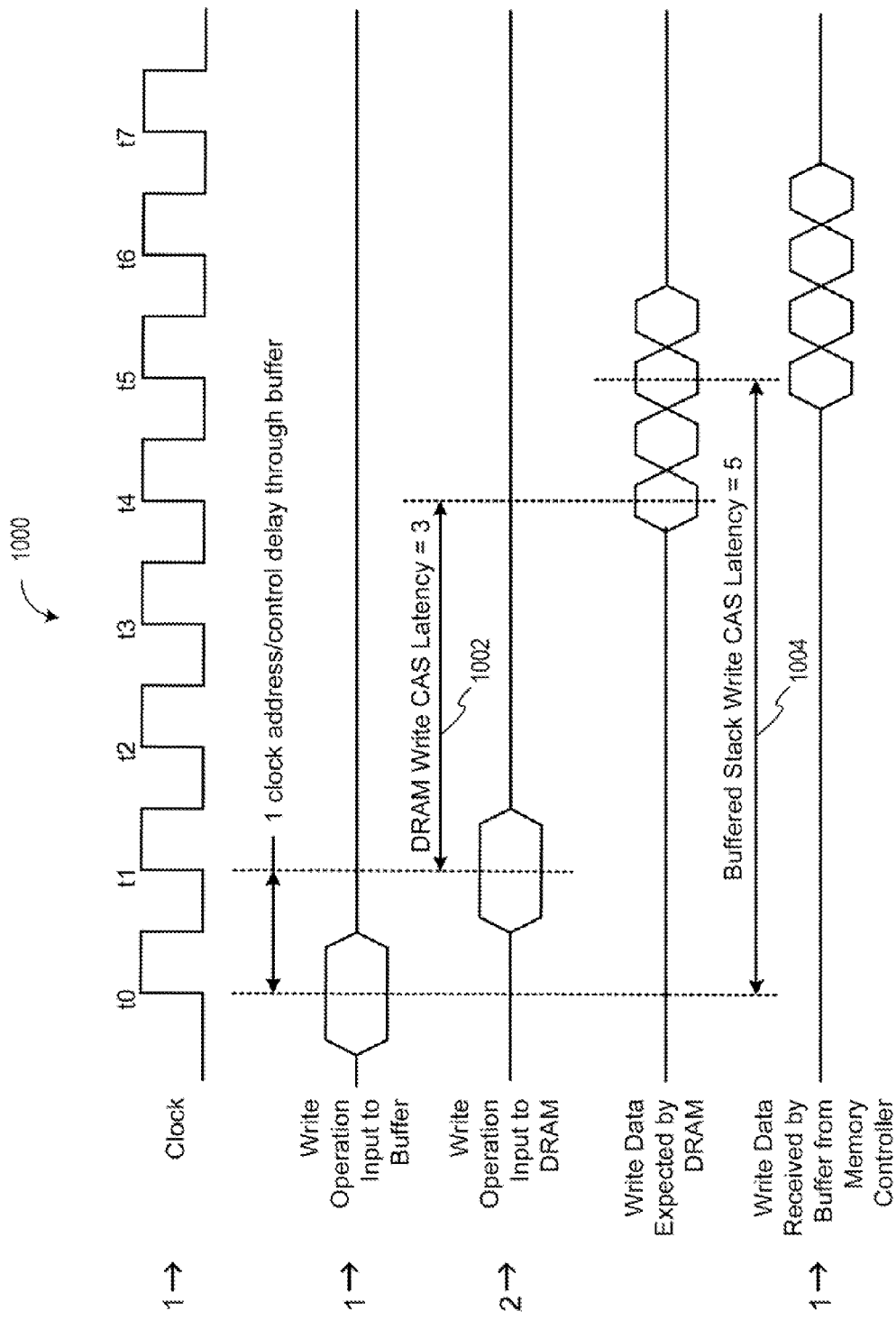
FIG. 10 shows a timing diagram showing the write data timing expected by DRAM in a buffered stack, in accordance with another embodiment of this invention.

FIG. 10 is a timing diagram illustrating a timing design 1000 of write data timing expected by a DRAM circuit in a buffered stack. Emulation of a larger capacity DRAM circuit having higher CAS latency (as in FIG. 9) may, in some implementations, create a problem with the timing of write operations. For example, with respect to a buffered stack of DDR2 SDRAM chips with a read CAS latency of four clocks which are used in emulating a single larger DDR2 SDRAM with a read CAS latency of six clocks, the DDR2 SDRAM protocol may specify that the write CAS latency 1002 is one less than the read CAS latency. Therefore, since the buffered stack appears as a DDR2 SDRAM with a read CAS latency of six clocks, the memory controller may use a buffered stack write CAS latency of five clocks 1004 when scheduling a write operation to the memory.

In the specific example shown, the memory controller issues the write operation at t0. After a one clock cycle delay through the buffer chip, the write operation is issued to the DRAM chips at t1. Because the memory controller believes it is connected to memory having a read CAS latency of six clocks and thus a write CAS latency of five clocks, it issues the write data at time t0+5=t5. But because the physical DRAM chips have a read CAS latency of four clocks and thus a write CAS latency of three clocks, they expect to receive the write data at time t1+3=t4. Hence the problem, which the buffer chip may alleviate by delaying write operations.

The waveform "Write Data Expected by DRAM" is not shown as belonging to interface 1, interface 2, or interface 3, for the simple reason that there is no such signal present in any of those interfaces. That waveform represents only what is expected by the DRAM, not what is actually provided to the DRAM.

Figure 11:
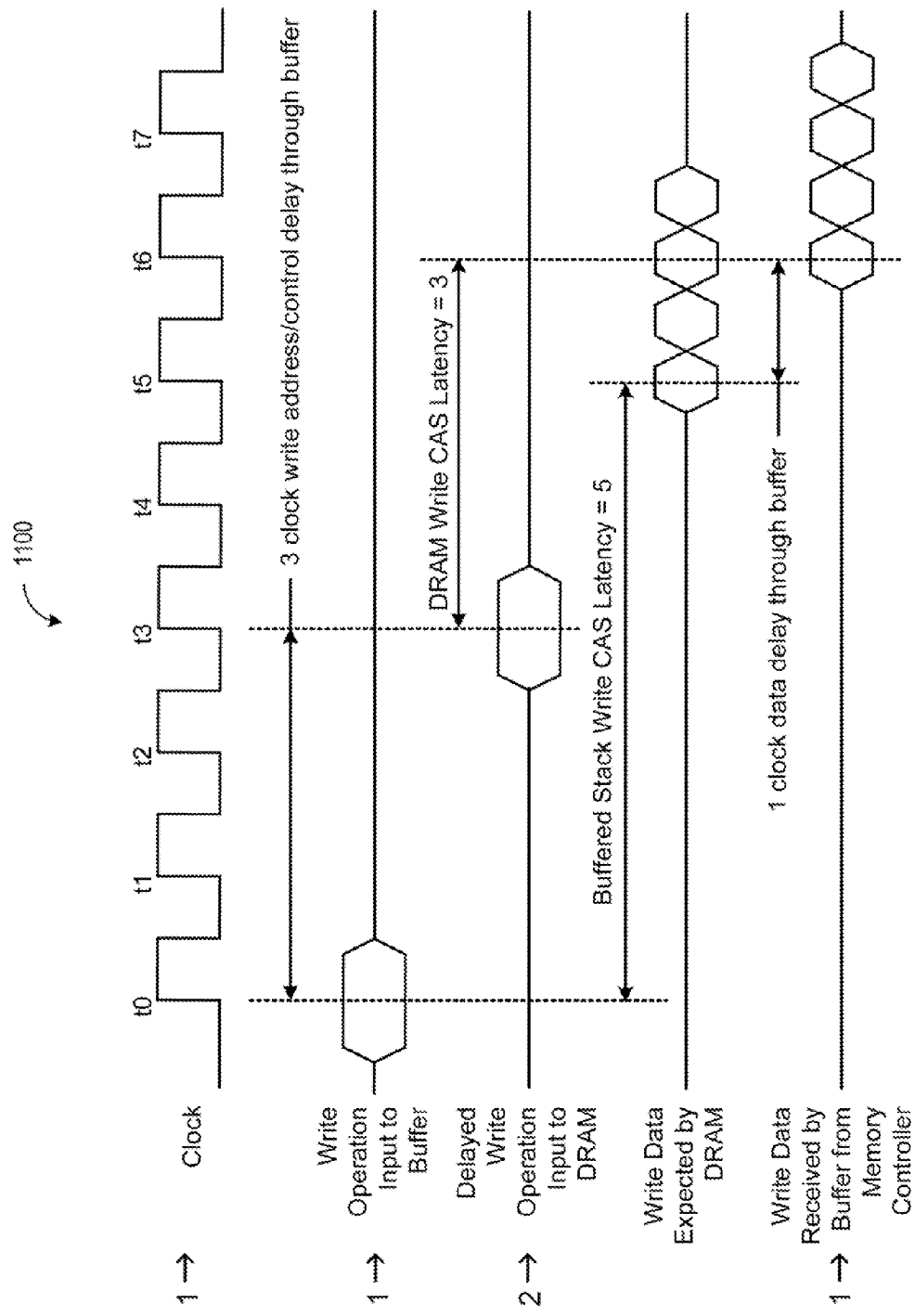
FIG. 11 is a timing diagram showing how write control signals are delayed by a buffer chip in accordance with another embodiment of this invention.

FIG. 11 is a timing illustrating a timing design 1100 showing how the butter chip does this. The memory controller issues the write operation at t0. In FIG. 10, the write operation appeared at the DRAM circuits one clock later at t1, clue to the inherent delay through the buffer chip. But in FIG. 11, in addition to the inherent one clock delay, the buffer chip has added an extra two clocks of delay to the write operation, which is not issued to the DRAM chips until t0+1+2=t3. Because the DRAM chips receive the write operation at t3 and have a write CAS latency of three clocks, they expect to receive the write data at t3+3=t6. Because the memory controller issued the write operation at t0, and it expects a write CAS latency of five clocks, it issues the write data at time t0+5=t5. After a one clock delay through the buffer chip, the write data arrives at the DRAM chips at t5+1=t6, and the timing problem is solved.

It should be noted that extra delay of j clocks (beyond the inherent delay) which the buffer chip deliberately adds before issuing the write operation to the DRAM is the sum j clocks of the inherent delay of the address and control signals and the inherent delay of the data signals. In the example shown, both those inherent delays are one clock, so j=2.

Figure 12:
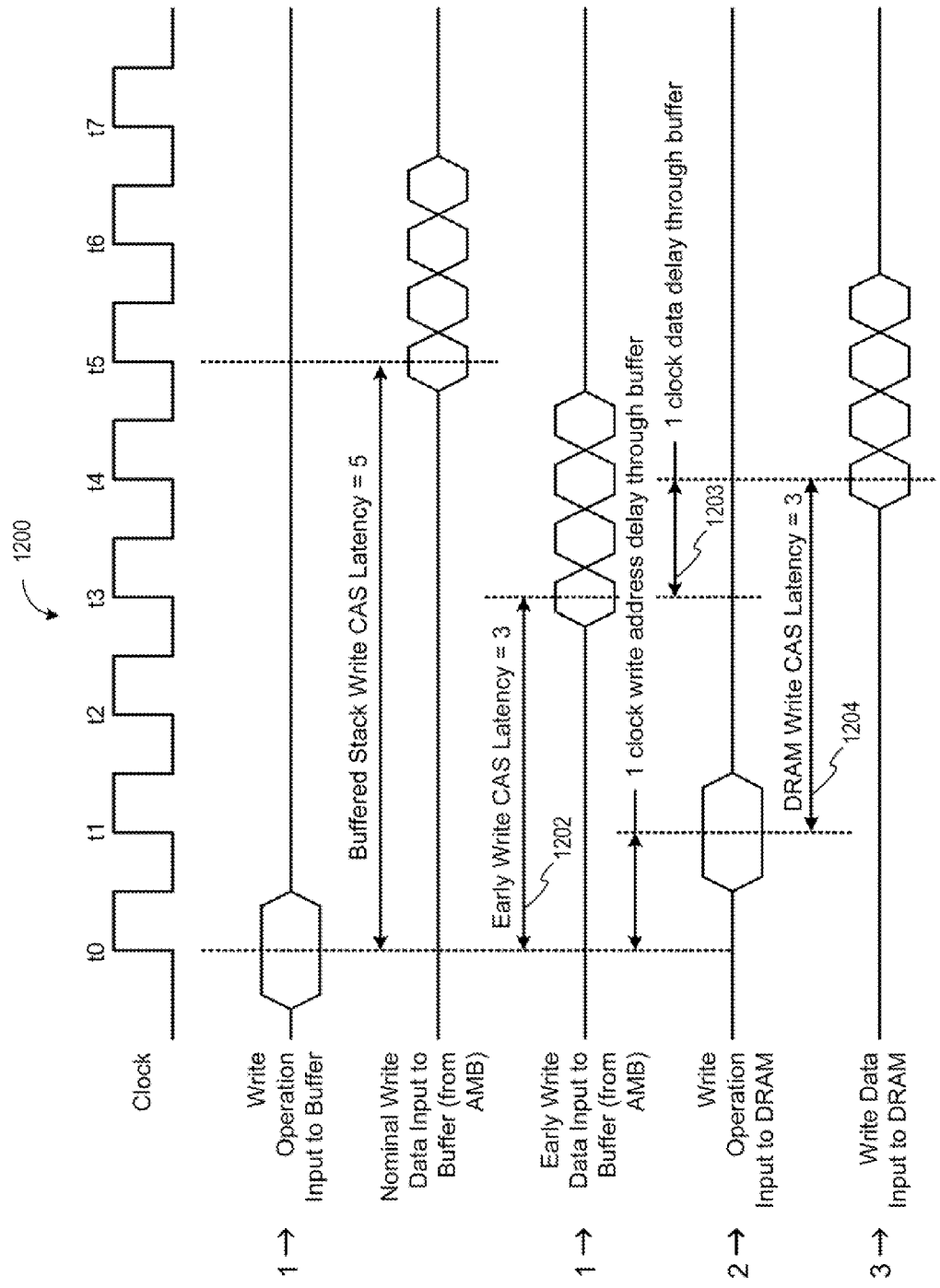
FIG. 12 is a timing diagram showing early write data from a memory controller or an advanced memory buffer (AMB) according to yet another embodiment of this invention.

FIG. 12 is a timing diagram illustrating operation of an FB-DIMM's AMB, which may be designed to send write data earlier to buffered stacks instead of delaying the write address and operation (as in FIG. 11). Specifically, it may use an early write CAS latency 1202 to compensate the timing of the buffer chip write operation. If the buffer chip has a cumulative (address and data) inherent delay of two clocks, the AMB may send the write data to the buffered stack two clocks early. This may not be possible in the case of registered DIMMs, in which the memory controller sends the write data directly to the buffered stacks (rather than via the AMB). In another embodiment, the memory controller itself could be designed to send write data early, to compensate for the j clocks of cumulative inherent delay caused by the buffer chip.

In the example shown, the memory controller issues the write operation at t0. After a one clock inherent delay through the buffer chip, the write operation arrives at the DRAM at t1. The DRAM expects the write data at t1+3=t4. The industry specification would suggest a nominal write data time of t0+5=t5, but the AMB (or memory controller), which already has the write data (which are provided with the write operation), is configured to perform an early write at t5−2=t3. After the inherent delay 1203 through the buffer chip, the write data arrive at the DRAM at t3+1=t4, exactly when the DRAM expects it—specifically, with a three-cycle DRAM Write CAS latency 1204 which is equal to the three-cycle Early Write CAS Latency 1202.

Figure 13:
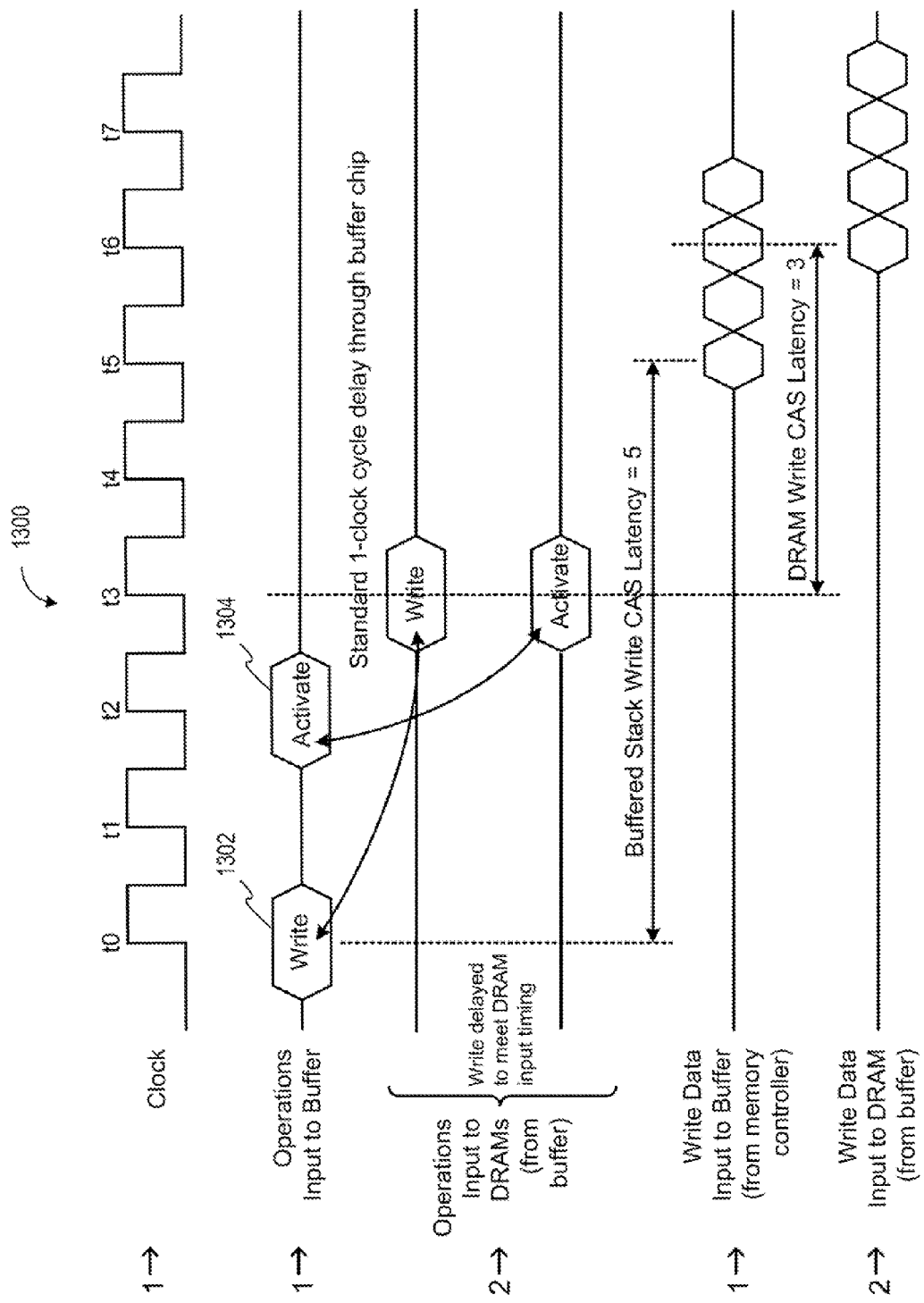
FIG. 13 is a timing diagram showing address bus conflicts caused by delayed write operations.

FIG. 13 is a timing diagram 1300 illustrating bus conflicts which can be caused by delayed write operations. The delaying of write addresses and write operations may be performed by a buffer chip, a register, an AMB, etc. in a manner that is completely transparent to the memory controller of the host system. And, because the memory controller is unaware of this delay, it may schedule subsequent operations such as activate or precharge operations, which may collide with the delayed writes on the address bus to the DRAM chips in the stack.

An example is shown, in which the memory controller issues a write operation 1302 at time t0. The buffer chip or AMB delays the write operation, such that it appears on the bus to the DRAM chips at time t3. Unfortunately, at time t2 the memory controller issued an activate operation (control signal) 1304 which, after a one-clock inherent delay through the buffer chip, appears on the bus to the DRAM chips at time t3, colliding with the delayed write.

Figure 14:
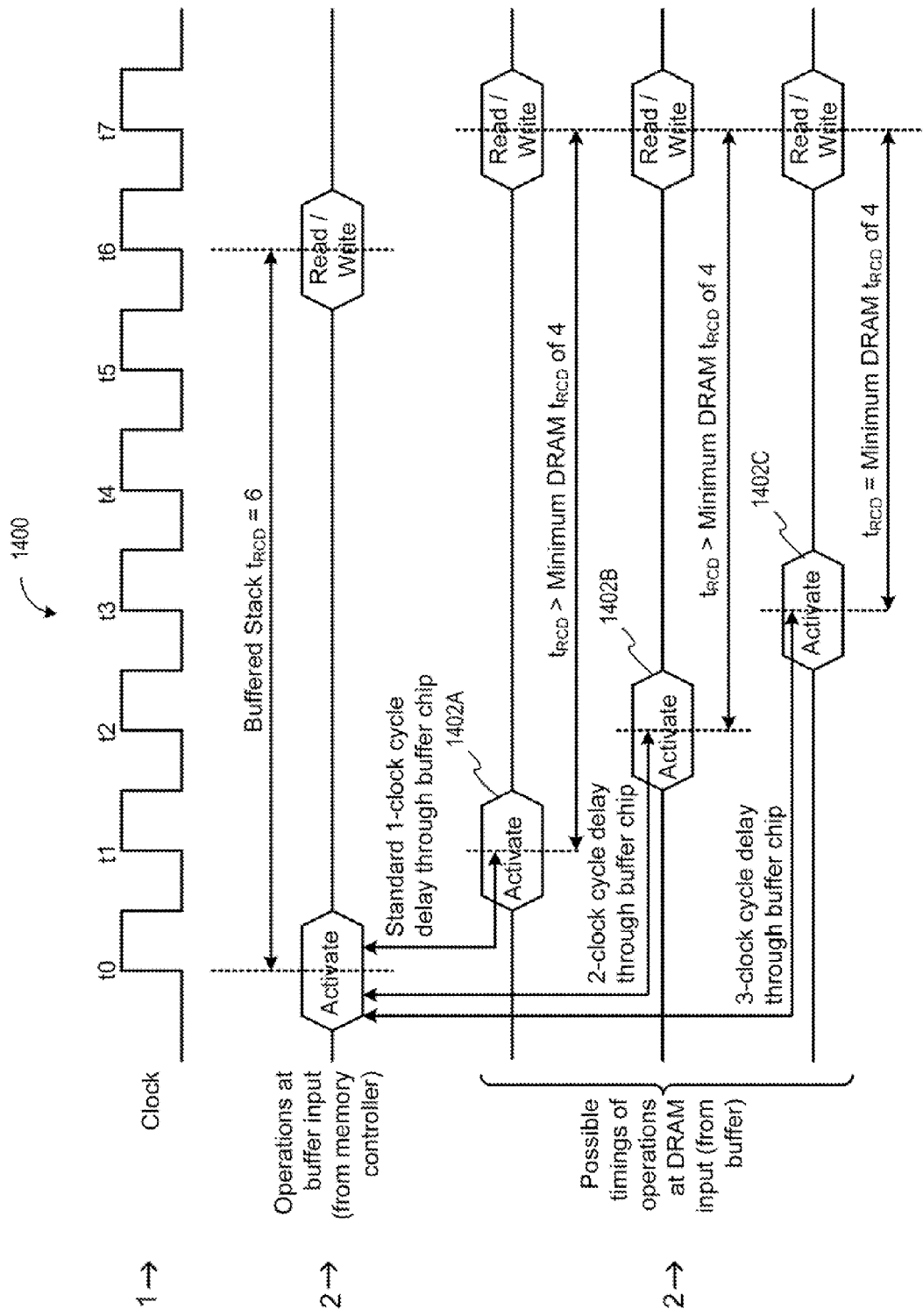
FIG. 14 is a timing diagram showing variable delay of an activate operation through a buffer chip.
Figure 15:
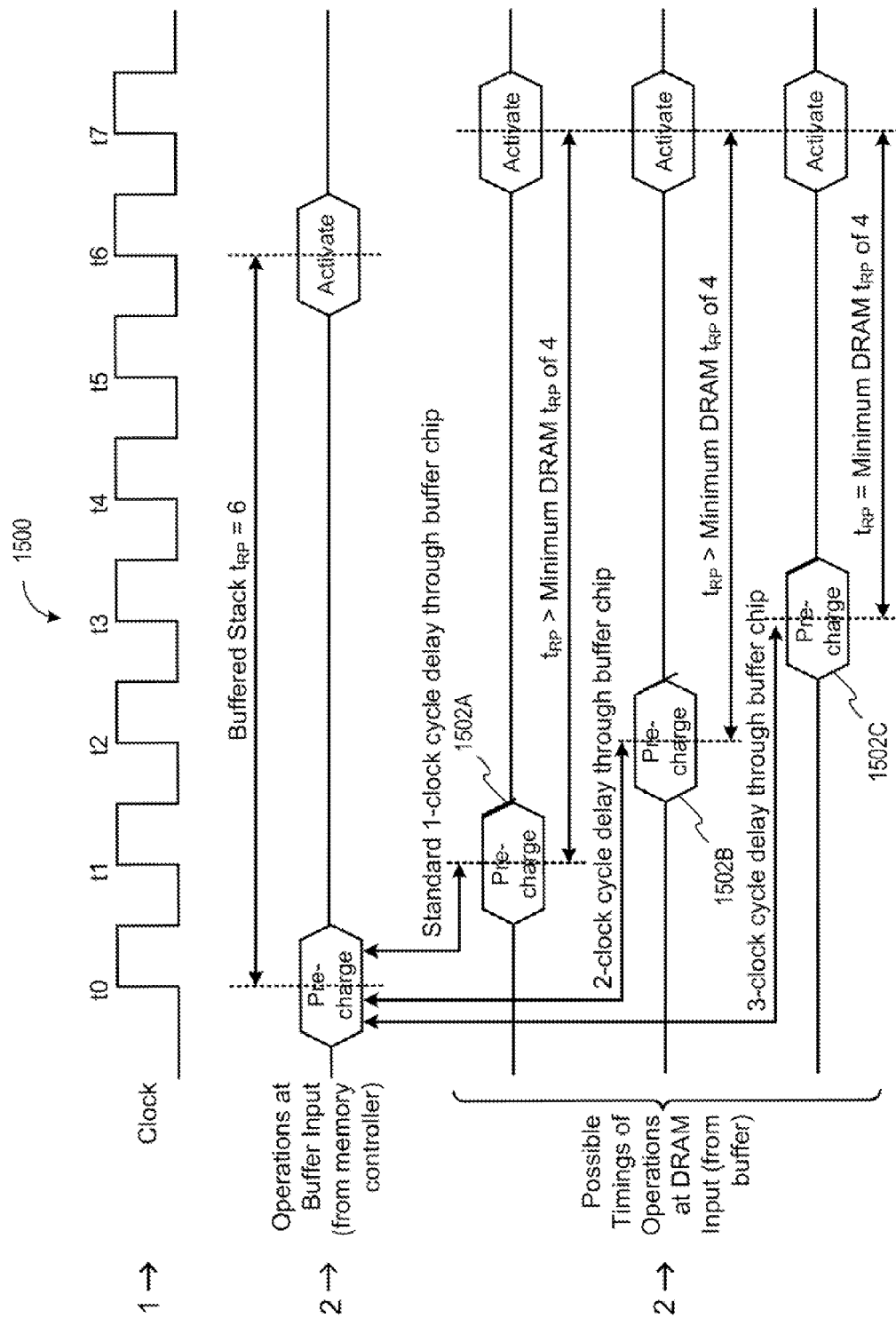
FIG. 15 is a timing diagram showing variable delay of a precharge operation through a buffer chip.

FIGS. 14 and 15 are a timing diagram 1400 and a timing diagram 1500 illustrating methods of avoiding such collisions. If the cumulative latency through the buffer chip is two clock cycles, and the native read CAS latency of the DRAM chips is four clock cycles, then in order to hide the delay of the address and control signals and the data signals through the buffer chip, the buffer chip presents the host system with an interface to an emulated memory having a read CAS latency of six clock cycles. And if the tRCD and tRP of the DRAM chips are four clock cycles each, the buffer chip tells the host system that they are six clock cycles each in order to allow the buffer chip to delay the activate and precharge operations to avoid collisions in a manner that is transparent to the host system.

For example, a buffered stack that uses 4-4-4 DRAM chips (that is, CAS latency=4, tRCD=4, and tRP=4) may appear to the host system as one larger DRAM that uses 6-6-6 timing.

Since the buffered stack appears to the host system's memory controller as having a tRCD of six clock cycles, the memory controller may schedule a column operation to a bank six clock cycles (at time t6) after an activate (row) operation (at time t0) to the same bank. However, the DRAM chips in the stack actually have a tRCD of four clock cycles. This gives the buffer chip time to delay the activate operation by up to two clock cycles, avoiding any conflicts on the address bus between the buffer chip and the DRAM chips, while ensuring correct read and write timing on the channel between the memory controller and the buffered stack.

As shown, the buffer chip may issue the activate operation to the DRAM chips one, two, or three clock cycles after it receives the activate operation from the memory controller, register, or AMB. The actual delay selected may depend on the presence or absence of other DRAM operations that may conflict with the activate operation, and may optionally change from one activate operation to another. In other words, the delay may be dynamic A one-clock delay (1402A, 1502A) may be accomplished simply by the inherent delay through the buffer chip. A two-clock delay (1402B, 1502B) may be accomplished by adding one clock of additional delay to the one-clock inherent delay, and a three-clock delay (1402C, 1502C) may be accomplished by adding two clocks of additional delay to the one-clock inherent delay. A read, write, or activate operation issued by the memory controller at time t6 will, after a one-clock inherent delay through the buffer chip, be issued to the DRAM chips at time t7. A preceding activate or precharge operation issued by the memory controller at time t0 will, depending upon the delay, be issued to the DRAM chips at time t1, t2, or t3, each of which is at least the tRCD or tRP of four clocks earlier than the t7 issuance of the read, write, or activate operation.

Since the buffered stack appears to the memory controller to have a tRP of six clock cycles, the memory controller may schedule a subsequent activate (row) operation to a bank a minimum of six clock cycles after issuing a precharge operation to that bank. However, since the DRAM circuits in the stack actually have a tRP of four clock cycles, the buffer chip may have the ability to delay issuing the precharge operation to the DRAM chips by up to two clock cycles, in order to avoid any conflicts on the address bus, or in order to satisfy the tRAS requirements of the DRAM chips.

In particular, if the activate operation to a bank was delayed to avoid an address bus conflict, then the precharge operation to the same bank may be delayed by the buffer chip to satisfy the tRAS requirements of the DRAM. The buffer chip may issue the precharge operation to the DRAM chips one, two, or three clock cycles after it is received. The delay selected may depend on the presence or absence of address bus conflicts or tRAS violations, and may change from one precharge operation to another.

Figure 16:
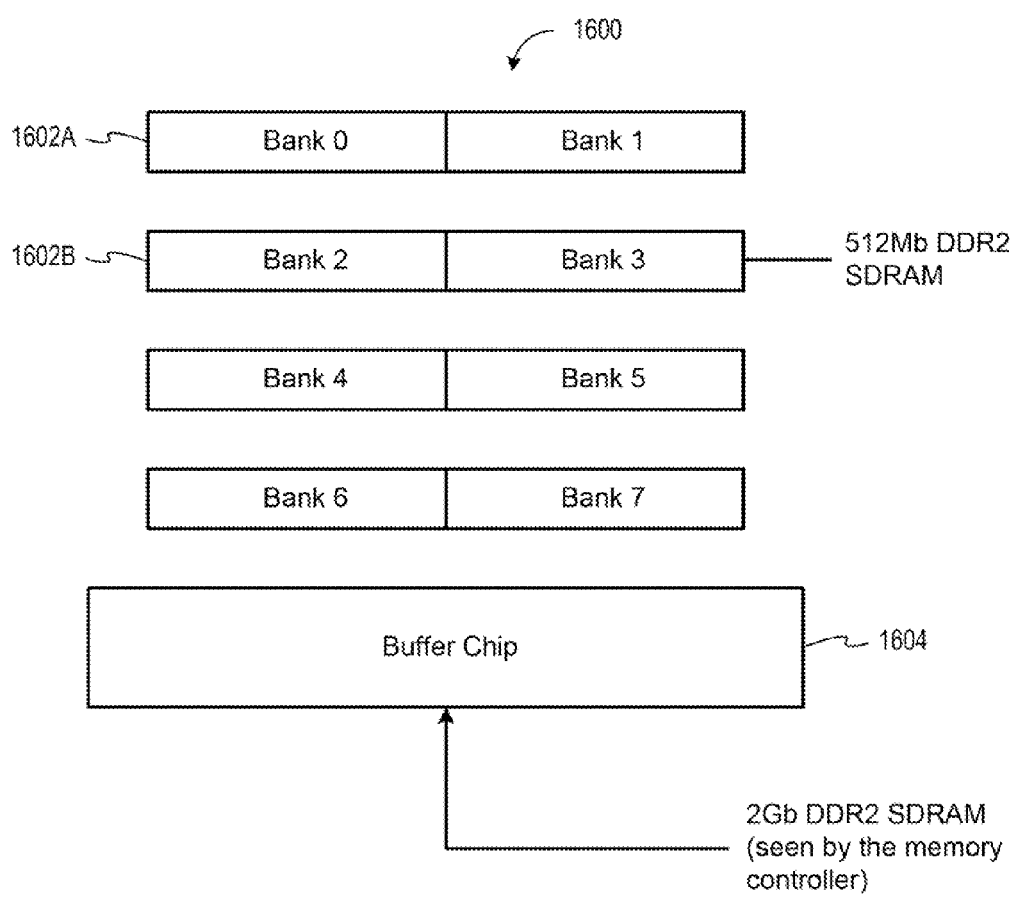
FIG. 16 shows a buffered stack of DRAM circuits and the buffer chip which presents them to the system as if they were a single, larger DRAM circuit, in accordance with one embodiment of this invention.

FIG. 16 illustrates a buffered stack 1600 according to one embodiment of this invention. The buffered stack includes four 512 Mb DDR2 DRAM circuits (chips) 1602 which a buffer chip 1604 maps to a single 2 Gb DDR2 DRAM.

Although the multiple DRAM chips appear to the memory controller as though they were a single, larger DRAM, the combined power dissipation of the actual DRAM chips may be much higher than the power dissipation of a monolithic DRAM of the same capacity. In other words, the physical DRAM may consume significantly more power than would be consumed by the emulated DRAM.

As a result, a DIMM containing multiple buffered stacks may dissipate much more power than a standard DIMM of the same actual capacity using monolithic DRAM circuits. This increased power dissipation may limit the widespread adoption of DIMMs that use buffered stacks. Thus, it is desirable to have a power management technique which reduces the power dissipation of DIMMs that use buffered stacks.

In one such technique, the DRAM circuits may be opportunistically placed in low power states or modes. For example, the DRAM circuits may be placed in a precharge power down mode using the clock enable (CKE) pin of the DRAM circuits.

A single rank registered DIMM (R-DIMM) may contain a plurality of buffered stacks, each including four x4 512 Mb DDR2 SDRAM chips and appear (to the memory controller via emulation by the buffer chip) as a single x4 2 Gb DDR2 SDRAM. The JEDEC standard indicates that a 2 Gb DDR2 SDRAM may generally have eight banks, shown in FIG. 16 as Bank 0 to Bank 7. Therefore, the buffer chip may map each 512 Mb DRAM chip in the stack to two banks of the equivalent 2 Gb DRAM, as shown; the first DRAM chip 1602A is treated as containing banks 0 and 1, 1602B is treated as containing banks 2 and 4, and so forth.

The memory controller may open and close pages in the DRAM banks based on memory requests it receives from the rest of the host system, in some embodiments, no more than one page may be able to be open in a bank at any given time. In the embodiment shown in FIG. 16, each DRAM chip may therefore have up to two pages open at a time. When a DRAM chip has no open pages, the power management scheme may place it in the precharge power down mode.

The clock enable inputs of the DRAM chips may be controlled by the buffer chip, or by another chip (not shown) on the R-DIMM, or by an AMB (not shown) in the case of an FB-DIMM, or by the memory controller, to implement the power management technique. The power management technique may be particularly effective if it implements a closed page policy.

Another optional power management technique may include mapping a plurality of DRAM circuits to a single bank of the larger capacity emulated DRAM. For example, a buffered stack (not shown) of sixteen x4 256 Mb DDR2 SDRAM chips may be used in emulating a single x4 4 Gb DDR2 SDRAM. The 4 Gb DRAM is specified by JEDEC as having eight banks of 512 Mbs each, so two of the 256 Mb DRAM chips may be mapped by the buffer chip to emulate each bank (whereas in FIG. 16 one DRAM was used to emulate two banks).

However, since only one page can be open in a bank at any given time, only one of the two DRAM chips emulating that bank can be in the active state at any given time. If the memory controller opens a page in one of the two DRAM chips, the other may be placed in the precharge power clown mode. Thus, if a number p of DRAM chips are used to emulate one bank, at least p-1 of them may be in a power down mode at any given time; in other words, at least p-1 of the p chips are always in power down mode, although the particular powered down chips will tend to change over time, as the memory controller opens and closes various pages of memory.

As a caveat on the term "always" in the preceding paragraph, the power saving operation may comprise operating in precharge power down mode except when refresh is required.

Figure 17:
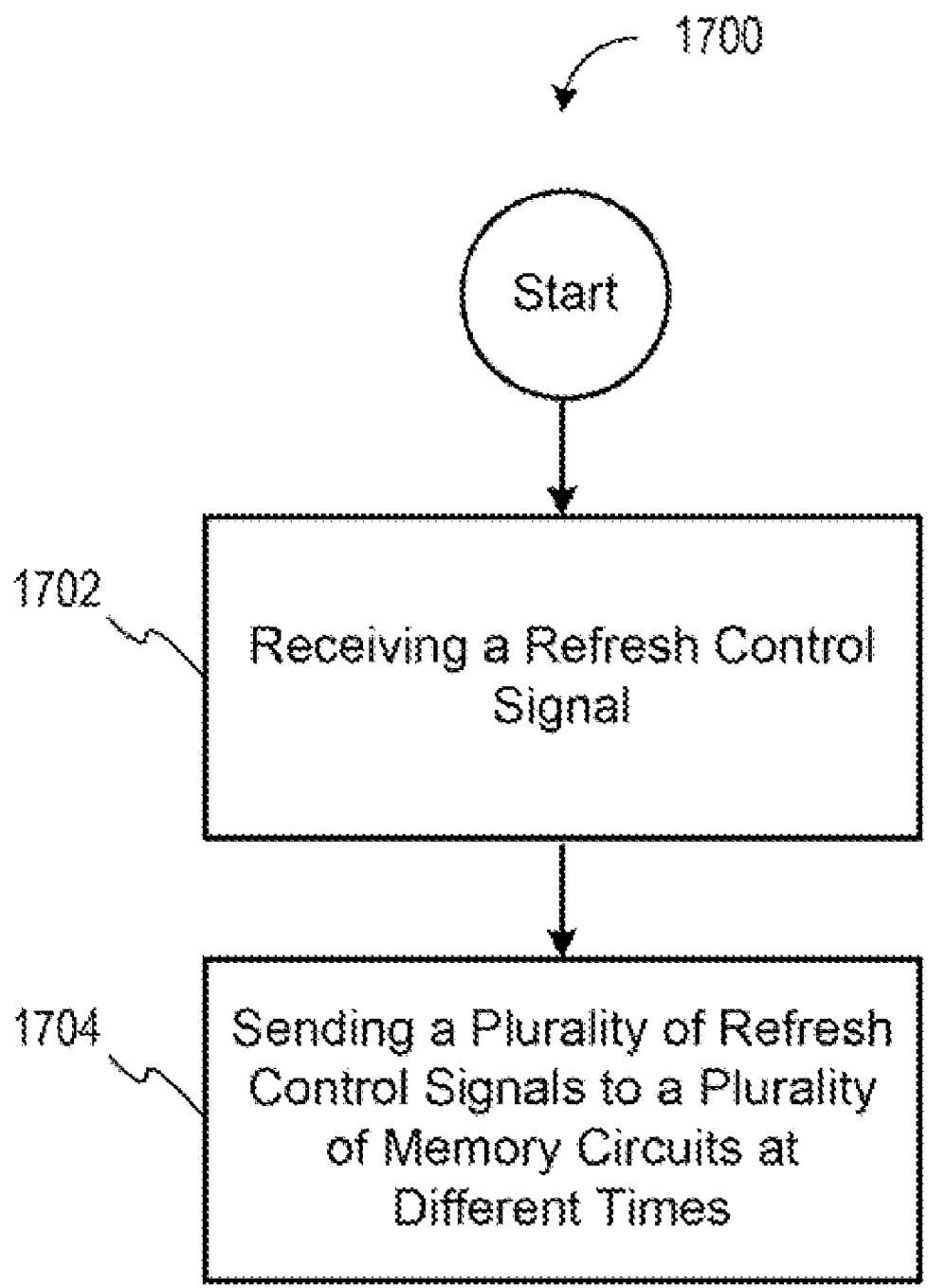
FIG. 17 is a flow chart showing a method of refreshing a plurality of memory circuits, in accordance with one embodiment of this invention.

FIG. 17 is a flow chart 1700 illustrating one embodiment of a method of refreshing a plurality of memory circuits. A refresh control signal is received (1702) e.g. from a memory controller which intends to refresh an emulated memory circuit. In response to receipt of the refresh control signal, a plurality of refresh control signals are sent (1704) e.g. by a buffer chip to a plurality of physical memory circuits at different times. These refresh control signals may optionally include the received refresh control signal or an instantiation or copy thereof. They may also, or instead, include refresh control signals that are different in at least one aspect (format, content, etc.) from the received signal.

In some embodiments, at least one first refresh control signal may be sent to a first subset of the physical memory circuits at a first time, and at least one second refresh control signal may be sent to a second subset of the physical memory circuits at a second time. Each refresh signal may be sent to one physical memory circuit, or to a plurality of physical memory circuits, depending upon the particular implementation.

The refresh control signals may be sent to the physical memory circuits after a delay in accordance with a particular timing. For example, the timing in which they are sent to the physical memory circuits may be selected to minimize an electrical current drawn by the memory, or to minimize a power consumption of the memory. This may be accomplished by staggering a plurality of refresh control signals. Or, the timing may be selected to comply with e.g. a tRFC parameter associated with the memory circuits.

To this end, physical DRAM circuits may receive periodic refresh operations to maintain integrity of data stored therein. A memory controller may initiate refresh operations by issuing refresh control signals to the DRAM circuits with sufficient frequency to prevent any loss of data in the DRAM circuits. After a refresh control signal is issued, a minimum time tRFC may be required to elapse before another control signal may be issued to that DRAM circuit. The tRFC parameter value may increase as the size of the DRAM circuit increases.

When the buffer chip receives a refresh control signal from the memory controller, it may refresh the smaller DRAM circuits within the span of time specified by the tRFC of the emulated DRAM circuit. Since the tRFC of the larger, emulated DRAM is longer than the tRFC of the smaller, physical DRAM circuits, it may not be necessary to issue any or all of the refresh control signals to the physical DRAM circuits simultaneously. Refresh control signals may be issued separately to individual DRAM circuits or to groups of DRAM circuits, provided that the tRFC requirements of all physical DRAMs has been met by the time the emulated DRAM's tRFC has elapsed. In use, the refreshes may be spaced in time to minimize the peak current draw of the combination buffer chip and DRAM circuit set during a refresh operation.

Figure 18:
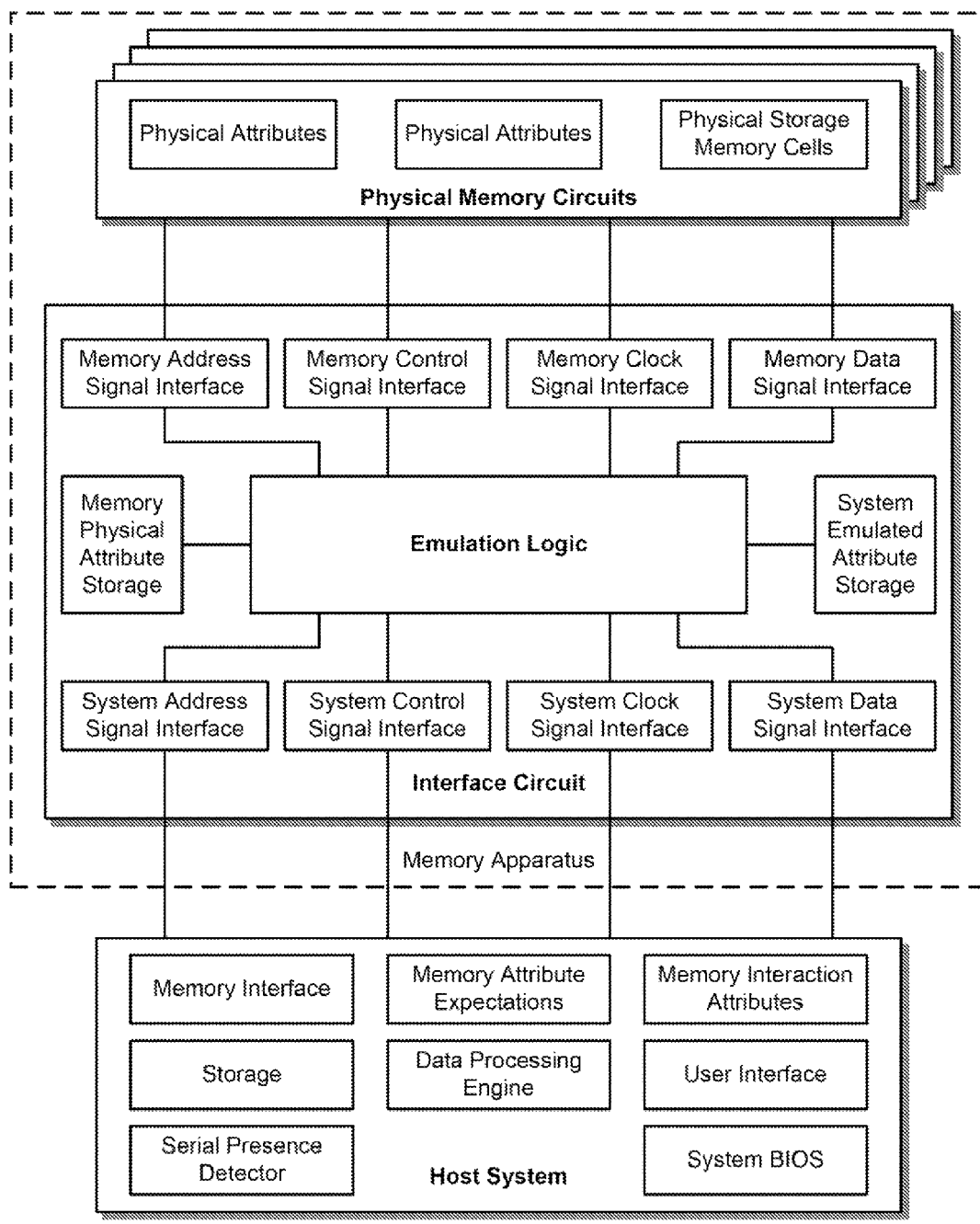
FIG. 18 shows a block diagram of another embodiment of the invention.

FIG. 18 illustrates one embodiment of an interface circuit such as may be utilized in any of the above-described memory systems, for interfacing between a system and memory circuits. The interface circuit may be included in the buffer chip, for example.

The interface circuit includes a system address signal interface for sending/receiving address signals to/from the host system, a system control signal interface for sending/receiving control signals to/from the host system, a system clock signal interface for sending/receiving clock signals to/from the host system, and a system data signal interface for sending/receiving data signals to/from the host system. The interface circuit further includes a memory address signal interface for sending/receiving address signals to/from the physical memory, a memory control signal interface for sending/receiving control signals to/from the physical memory, a memory clock signal interface for sending/receiving clock signals to/from the physical memory, and a memory data signal interface for sending/receiving data signals to/from the physical memory.

The host system includes a set of memory attribute expectations, or built-in parameters of the physical memory with which it has been designed to work (or with which it has been told, e.g. by the buffer circuit, it is working). Accordingly, the host system includes a set of memory interaction attributes, or built-in parameters according to which the host system has been designed to operate in its interactions with the memory. These memory interaction attributes and expectations will typically, but not necessarily, be embodied in the host system's memory controller.

In addition to physical storage circuits or devices, the physical memory itself has a set of physical attributes.

These expectations and attributes may include, by way of example only, memory timing, memory capacity, memory latency, memory functionality, memory type, memory protocol, memory power consumption, memory current requirements, and so forth.

The interface circuit includes memory physical attribute storage for storing values or parameters of various physical attributes of the physical memory circuits. The interface circuit further includes system emulated attribute storage. These storage systems may be read/write capable stores, or they may simply be a set of hard-wired logic or values, or they may simply be inherent in the operation of the interface circuit.

The interface circuit includes emulation logic which operates according to the stored memory physical attributes and the stored system emulation attributes, to present to the system an interface to an emulated memory which differs in at least one attribute from the actual physical memory. The emulation logic may, in various embodiments, alter a timing, value, latency, etc. of any of the address, control, clock, and/or data signals it sends to or receives from the system and/or the physical memory. Some such signals may pass through unaltered, while others may be altered. The emulation logic may be embodied as, for example, hardwired logic, a state machine, software executing on a processor, and so forth.

CONCLUSION

When one component is said to be "adjacent" another component, it should not be interpreted to mean that there is absolutely nothing between the two components, only that they are in the order indicated.

The physical memory circuits employed in practicing this invention may be any type of memory whatsoever, such as: DRAM, DDR DRAM, DDR2 DRAM, DDR3 DRAM, SDRAM, QDR DRAM, DRDRAM, FPM DRAM, VDRAM, EDO DRAM, BEDO DRAM, MDRAM, SGRAM, MR AM, IRAM, NAND flash, NOR flash, PSRAM, wetware memory, etc.

The physical memory circuits may be coupled to any type of memory module, such as: DIMM, R-DIMM, SO-DIMM, FB-DIMM, unbuffered DIMM, etc.

The system device which accesses the memory may be any type of system device, such as: desktop computer, laptop computer, workstation, server, consumer electronic device, television, personal digital assistant (PDA), mobile phone, printer or other peripheral device, etc.

The various features illustrated in the figures may be combined in many ways, and should not be interpreted as though limited to the specific embodiments in which they were explained and shown.

Those skilled in the art, having the benefit of this disclosure, will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. A memory apparatus for use with a host system, the memory apparatus comprising:
    a plurality of memory circuits on a registered dual in-line memory module (R-DIMM); and
    one or more components electrically couplable to the host system, the one or more components being operable to present to the host system a simulated memory circuit where there is a difference in at least one aspect between the simulated memory circuit and one or more memory circuits of the plurality of memory circuits,
    wherein each memory circuit of the plurality of memory circuits is electrically coupled to at least one of the one or more components, where the one or more components are further operable to identify at least one memory circuit of the plurality of memory circuits that is not being accessed; and
    a chip on the R-DIMM operable to perform a power-saving operation on the at least one memory circuit identified as not being accessed.

2. The memory apparatus of claim 1, where the one or more components comprise a register or a buffer.

3. The memory apparatus of claim 1, where the simulated memory circuit presents a simulated control interface and a simulated data interface between the host system and the plurality of memory circuits.

4. The memory apparatus of claim 3, where the simulated control interface is configured to send and receive control, command, and clock signals, and the simulated data interface is configured to send and receive data signals.

5. The memory apparatus of claim 1, where the plurality of memory circuits comprise a stack of dynamic random access memory (DRAM) circuits on the R-DIMM.

6. The memory apparatus of claim 5, where the stack further includes the one or more components.

7. The memory apparatus of claim 1, where the power-saving operation comprises placing the at least one memory circuit identified as not being accessed in a precharge power down mode.

8. The memory apparatus of claim 7, where the one or more components are operable to place each memory circuit identified as not being accessed in a precharge power down mode by controlling a respective clock enable input of each memory circuit identified as not being accessed.

9. The memory apparatus of claim 1, where the one or more components are operable to identify the at least one memory circuit of the plurality of memory circuits as not being accessed based on how many pages are open in each respective memory circuit of the plurality of memory circuits.

10. The memory apparatus of claim 1, where the first components and second components are operable to perform the power saving operation by controlling a respective clock-enable pin of the at least one memory circuit identified as not being accessed.

11. The memory apparatus of claim 1, where the first components and second components are further operable to select one or more of the plurality of memory circuits by generating one or more chip select signals and to perform an operation on the one or more selected memory circuits.

12. A memory apparatus for use with a host system, the memory apparatus comprising:
    an interface circuit; and
    a plurality of memory circuits, each memory circuit of the plurality of memory circuits being electrically coupled to the interface circuit,
    where the interface circuit is operable to present to the host system a simulated memory circuit, where there is a difference in at least one aspect between the simulated memory circuit and at least one of the plurality of memory circuits, and
    where the interface circuit is further operable to identify at least one memory circuit of the plurality of memory circuits as not being accessed and to perform a power-saving operation on the at least one memory circuit identified as not being accessed.

13. The memory apparatus of claim 12, where the interface circuit includes one or more registers and one or more buffer chips,
    where the one or more registers are operable to present a control interface between the host system and the plurality of memory circuits, and
    where the one or more buffer chips are operable to present a data interface between the host system and the plurality of memory circuits.

14. The memory apparatus of claim 12, where the interface circuit comprises a plurality of components, the plurality of components including one or more registers and one or more buffers,
    where the one or more registers are operable to present a control interface and an address interface between the host system and the plurality of memory circuits, and
    where the one or more buffers are operable to present a data interface between the host system and the plurality of memory circuits.

15. The memory apparatus of claim 12, where the power-saving operation comprises placing the at least one memory circuit identified as not being accessed in a precharge power down mode.

16. The memory apparatus of claim 15, where the interface circuit is operable to place each memory circuit identified as not being accessed in a precharge power down mode by controlling a respective clock enable input of each memory circuit identified as not being accessed.

17. The memory apparatus of claim 12, where the interface circuit is operable to identify the at least one of the plurality of memory circuits as not being accessed based on how many pages are open in each respective memory circuit of the plurality of memory circuits.

* * * * *